(12) United States Patent
Ballandras et al.

(10) Patent No.: US 11,606,079 B2
(45) Date of Patent: Mar. 14, 2023

(54) TRANSDUCER STRUCTURE FOR SOURCE SUPPRESSION IN SAW FILTER DEVICES

(71) Applicant: FREC'N'SYS, Besançon (FR)

(72) Inventors: Sylvain Ballandras, Besançon (FR); Florent Bernard, Besançon (FR); Emilie Courjon, Franois (FR)

(73) Assignee: FREC'N'SYS, Besançon (FR)

( * ) Notice: Subject to any disclaimer, the term of this patent is extended or adjusted under 35 U.S.C. 154(b) by 78 days.

(21) Appl. No.: 16/980,328

(22) PCT Filed: Mar. 14, 2019

(86) PCT No.: PCT/EP2019/056431
§ 371 (c)(1),
(2) Date: Sep. 11, 2020

(87) PCT Pub. No.: WO2019/175317
PCT Pub. Date: Sep. 19, 2019

(65) Prior Publication Data
US 2021/0044273 A1 Feb. 11, 2021

(30) Foreign Application Priority Data
Mar. 16, 2018 (FR) ...................... 1852277

(51) Int. Cl.
*H03H 9/145* (2006.01)
*H03H 9/02* (2006.01)
*H03H 9/64* (2006.01)

(52) U.S. Cl.
CPC .... *H03H 9/14582* (2013.01); *H03H 9/02574* (2013.01); *H03H 9/02834* (2013.01); *H03H 9/14552* (2013.01); *H03H 9/6483* (2013.01)

(58) Field of Classification Search
CPC ........... H03H 9/14582; H03H 9/02574; H03H 9/02834; H03H 9/14552; H03H 9/6483
(Continued)

(56) References Cited

U.S. PATENT DOCUMENTS 5,952,765 A 9/1999 Garber et al.
5,998,907 A 12/1999 Taguchi et al.
(Continued)

FOREIGN PATENT DOCUMENTS

DE 102017108483 A1 10/2017
JP 2000-315931 A 11/2000
(Continued)

OTHER PUBLICATIONS

International Search Report for International Application No. PCT/EP2019/056431 dated Apr. 26, 2019, 4 pages.
(Continued)

*Primary Examiner* — Rakesh B Patel
*Assistant Examiner* — Jorge L Salazar, Jr.
(74) *Attorney, Agent, or Firm* — TraskBritt

(57) ABSTRACT

A transducer structure for a surface acoustic wave device, comprising a pair of inter-digitated comb electrodes, wherein the pair of inter-digitated comb electrodes comprises neighboring electrode means belonging to different comb electrodes and having a pitch p being defined as the edge-to-edge electrode means distance between two neighboring electrode means, the pitch p satisfying the Bragg condition; characterized in that the pair of inter-digitated comb electrodes comprises at least one region in which two or more neighboring electrode means belong to the same comb electrode while having an edge-to-edge distance to each other corresponding to the pitch p. The present disclosure relates also to a surface acoustic wave filter device.

23 Claims, 10 Drawing Sheets

(58) Field of Classification Search
USPC .................................... 333/133, 193–196
See application file for complete search history.

(56) References Cited

U.S. PATENT DOCUMENTS

| | | | |
|---|---|---|---|
| 2002/0171329 A1* | 11/2002 | Jian | H03H 9/14505 310/313 R |
| 2010/0182101 A1* | 7/2010 | Suzuki | H03H 9/173 333/193 |
| 2011/0109196 A1 | 5/2011 | Goto et al. | |
| 2017/0104470 A1 | 4/2017 | Koelle et al. | |

FOREIGN PATENT DOCUMENTS

| | | |
|---|---|---|
| JP | 2002-009584 A | 1/2002 |
| JP | 2002-353769 A | 12/2002 |
| JP | 2003-017967 A2 | 1/2003 |
| JP | 2009-267665 A2 | 12/2009 |
| JP | 2016-121818 A | 7/2016 |
| JP | 2017-022229 A | 1/2017 |
| JP | 2017-222029 A | 12/2017 |
| WO | 02/093739 A1 | 11/2002 |
| WO | 2010/004741 A1 | 1/2010 |

OTHER PUBLICATIONS

International Written Opinion for International Application No. PCT/EP2019/056431 dated Apr. 26, 2019, 6 pages.
Miura et al., Temperature Compensated LiTaO3/Sapphire Bonded SAW Substrate with Low Loss and High Coupling Factor Suitable for US-PCS Application. 2004 IEEE Ultrasonic Symposium, vol. 2, (Aug. 23, 2004), pp. 1322-1324.
Japanese Notice of Reasons for Refusal for Application No. 2020-545804 dated Nov. 9, 2021, 18 pages with translation.
Lee, D. Excitation and Detection of Surface Skimming Bulk Waves on Rotated Y-Cut Quartz, IEEE Transactions on Sonics and Ultrasonics, vol. SU-27, N° 1, (1980), pp. 22-30.
Milsorn et al., Analysis of generation and detection 15 of surface and bulk acoustic waves by interdigital transducers, IEEE Transactions on Sonics and Ultrasonics, vol. SU-24, (1977), pp. 147-166.
Japanese Notification of Reasons for Refusal for Application No. 2020-545804 dated Oct. 11, 2022.

\* cited by examiner

TRANSDUCER STRUCTURE FOR SOURCE SUPPRESSION IN SAW FILTER DEVICES

CROSS-REFERENCE TO RELATED APPLICATIONS

This application is a national phase entry under 35 U.S.C. § 371 of International Patent Application PCT/EP2019/056431, filed Mar. 14, 2019, designating the United States of America and published as International Patent Publication WO 2019/175317 A1 on Sep. 19, 2019, which claims the benefit under Article 8 of the Patent Cooperation Treaty to French Patent Application Serial No. 1852277, filed Mar. 16, 2018.

TECHNICAL FIELD

The present disclosure relates to surface acoustic wave filter devices and, more particularly, to transducer structures for surface acoustic wave filter devices.

BACKGROUND

In recent years, surface acoustic wave (SAW) devices have been employed in an increasing number of practical applications, such as filters, sensors and delay lines. In particular, SAW filters are interesting for mobile phone applications due to their ability to form low loss high order bandpass filters without employing complex electrical circuits. Therefore, SAW filters provide significant advantages in performance and size over other filter technologies.

In a typical surface acoustic wave device, one or more inter-digitated transducers (IDTs) are used to convert acoustic waves to electrical signals and vice versa by exploiting the piezoelectric effect of certain materials. An interdigital transducer (IDT) comprises opposing "combs" with inter-digitated metal fingers disposed on a piezoelectric substrate. A surface acoustic wave can be established on the substrate by electrically exciting the fingers. Conversely, an electrical signal can be induced across the fingers by a surface acoustic wave propagating in the piezoelectric substrate material beneath the transducer.

SAW devices commonly use wafers made from a monolithic Quartz, $LiNbO_3$ or $LiTaO_3$ crystals as piezoelectric materials. However, the use of piezoelectric substrates suffers either high sensibility to temperature or weak electromechanical coupling depending on the piezoelectric material used, which results in poor performance of the filters' passband characteristics.

One approach has led to the use of composite substrates for such devices. A composite substrate can comprise one or more layers formed on a base substrate. The design of a single layer on top of the substrate is a preferred option as it is a simple design and allows the use of base substrates, which are not piezoelectric, as long as the top single layer is made of a piezoelectric material. A composite substrate with a combination of strong coupling, e.g., electromechanical coefficient $k_s^2$ larger than 1% and temperature stability, e.g., for temperature coefficient of frequency (TCF) smaller than 10 ppm/K, will enhance the performance of the SAW devices and gives flexibility of design.

A composite substrate gives a large choice of materials for the base substrate and base substrate materials with high acoustic wave propagation velocity can be chosen, such as Diamond, Sapphire, Silicon Carbide and even Silicon.

It is also possible to reduce the temperature sensibility of the device fabricated on a composite substrate compared to a device fabricated on a piezoelectric substrate by adjusting the materials being used considering their temperature coefficient of frequency (TCF). For example, it is possible to use two materials with opposite temperature coefficient of frequency (TCF), which results in SAW devices that are spectrally more stable over temperature. It is also possible to use a substrate, which exhibits a thermal expansion smaller than the one of the top layer, therefore imposing the composite thermal expansion and yielding TCF reduction as well.

Finally, the choice of materials, their combination, their orientation and the thickness of the top single layer offer a wide range of design possibilities compared to the use of piezoelectric substrates alone, which gives room for improving the SAW devices in the field of filtering of high frequencies.

However, up to now, while some SAW filter devices based on a composite structure may provide good temperature characteristics, they still suffer a significant degradation in filter passband performance as disclosed in U.S. Pat. No. 5,998,907, resulting in higher insertion loss and a narrowing of the passband, which renders them unsuitable for mobile applications.

Furthermore, SAW filter devices based on composite substrates do also show a high level of parasitic modes, corresponding to the excited modes arising at the surface being reflected at the interface piezoelectric layer/substrate. Such effect is typically observed once the layer thickness of the piezoelectric layer is larger than a half-wavelength. Such effect is actually also observed for SAW filters based on relatively thin bulk substrate, with a thickness of the order of 250 µm or less, due to the reflection at the interface between the bottom surface of the substrate and air.

This results in is the so-called "rattle effect," outside of the bandpass of the filter, reducing the performance of the filter device and more particularly its out-band rejection. Various approaches have tried to deal with these spurious resonances, such as, for example, in DE 102017108483, by adding an extra layer at the interface reducing the reflections or as in U.S. 2017/0104470, by modulating the electrode pitch of the transducer structure throughout different portions of the transducer. But such approaches introduce fabrication constraints and limitations to the SAW filter devices.

Therefore, the performance of SAW filters on a composite substrate still needs to be improved.

BRIEF SUMMARY

The object of the present disclosure is to overcome the drawbacks cited previously by providing a surface acoustic wave filter device deposited on a composite substrate with improved parameters.

The object of the present disclosure is achieved by a transducer structure for a surface acoustic wave device, formed on an acoustic wave propagating substrate, the transducer being adapted to coupling to an electrical load and/or source, comprising a pair of inter-digitated comb electrodes formed on the substrate, wherein the pair of inter-digitated comb electrodes comprises neighboring electrode means belonging to different comb electrodes and having a pitch p being defined as the edge-to-edge electrode means distance between two neighboring electrode means, the pitch p satisfying the Bragg condition given by $p=\lambda/2$, $\lambda$ being the operating acoustic wavelength of the transducer, characterized in that the pair of inter-digitated comb electrodes comprises at least one region in which two or more neighboring electrode means belong to the same comb electrode while having an edge-to-edge distance to each other corresponding to the pitch p. The operating acoustic wavelength l of the transducer corresponds to the resonant frequency $f_r$ of the transducer structure as $f_r=V/2p=V/\lambda$, V being the acoustic wave propagation velocity in the acoustic wave propagating substrate. It is possible to use a transducer structure at the Bragg condition in a synchronous mode and to modify at least one region of the transducer structure in order to possibly reduce the electro-acoustic source density of the transducer structure, without modifying its characteristical features. Indeed, an electro-acoustic source is defined by two neighboring electrode means being connected to alternating/different potentials.

Therefore, at least two or more neighboring electrode means being connected to the same potential lead to the suppression of one or more electro-acoustic sources in the device. Thus less acoustics waves are generated and detected. It becomes therefore possible to control the excitation and detection efficiency of acoustic waves of the transducer structure by suppression of one or more electro-acoustic sources in the transducer structure, without modifying its characteristical features. Furthermore, since composite substrates or thin bulk substrates are known to lead to parasitic modes in the filter characteristics of a SAW filter device, a reduction in the electrochemical coupling coefficient $k_s^2$ of the transducer structure present in the SAW filer device by suppression of one or more electro-acoustic sources in the transducer structure should lead to a reduction in the presence or detection of these parasitic modes. It is here possible to reduce the electrochemical coupling coefficient $k_s^2$ in the transducer structure by a factor proportional to the electro-acoustic source density considering the overall transducer length and electrode means number of the transducer structure.

According to a variant of the present disclosure, the transducer structure can comprise a pair of inter-digitated comb electrodes formed on the substrate, wherein the pair of inter-digitated comb electrodes comprises neighboring electrode means belonging to different comb electrodes and having a pitch p being defined as the edge-to-edge electrode means distance between two neighboring electrode means, the pitch p satisfying the Bragg condition given by $p=\lambda/2$, $\lambda$ being the operating acoustic wavelength of the transducer, and wherein the electrode means all have the same geometry; characterized in that the pair of inter-digitated comb electrodes comprises at least one region in which two or more neighboring electrode means belong to the same comb electrode while having an edge-to-edge distance to each other corresponding to the pitch p and having the same geometry. In a variant all electrode means have the same geometry.

Also in these variants, it is possible to use a transducer structure at the Bragg condition in a synchronous mode and at least one region of the transducer structure is modified to reduce the electro-acoustic source density of the transducer structure. It becomes therefore possible to control the excitation and detection efficiency of acoustic waves of the transducer structure by suppression of one or more electro-acoustic sources in the transducer structure. Furthermore, the electrochemical coupling coefficient $k^2$ in the transducer structure can be reduced by a factor proportional to the electro-acoustic source density considering the overall transducer length and electrode number of the transducer structure. It is thus possible to reduce the presence or at least the detection of the parasitic modes due to the reflected electro-acoustic waves in the substrate in the transducer structure.

According to a variant of the present disclosure, the transducer structure comprises a plurality of regions with two or more electrode means belonging to the same comb electrode. Thereby the suppression of electro-acoustic sources is increased in the transducer structure and enables to further reduce the electromechanical coupling coefficient $k_s^2$ of the transducer. The presence or at least the detection by the transducer structure of the parasitic modes due to the reflected electro acoustic waves in the substrate should thus also be reduced.

According to a variant of the present disclosure, the electrode means is an electrode finger or split fingers, the split fingers comprising two or more adjacent electrode fingers at the same potential. It is thereby possible to use the suppression of electro-acoustic sources for various type of transducer structure, not only for the single electrode transducer structure but also e.g., for the double finger electrode transducer.

According to a variant of the present disclosure, regions with two or more neighboring electrode means belonging to the same comb electrode are not periodically distributed, in particular, are randomly distributed. Thus, the suppression of electro-acoustic sources and the excitation of electro-acoustic waves is not realized in a periodic way. Another positive effect of distributing the regions in a non-periodic way is that sub-harmonic effects generated by the transducer structure are reduced or even suppressed.

According to a variant of the present disclosure, the at least one region, in particular, each of the at least one region, with two or more neighboring electrode means belonging to the same comb electrode comprises an even number, in particular, only two, of neighboring electrode means belonging to the same comb electrode. Having an even number of neighboring electrode fingers connected to the same potential in the transducer structure actually results in a suppression of electro-acoustic sources as well as a phase change of π of the surface acoustic waves generated within the transducer structure. It is therefore possible to reduce the electromechanical coupling coefficient $fe^2$ of the transducer structure further. In the particular case, where only two electrode fingers are connected to the same potential, only a phase change of π of the surface acoustic waves generated within the transducer structure takes place, resulting in a reduction of the electromechanical coupling coefficient of $k_s^2$, in particular, here by a factor of two. The idea is to create destructive interference by combining the energy emitted from each side of the two electrode fingers connected to the same comb electrode toward the transducer, whereas the energy emitted toward the outside of the transducer will actually be launched and reflected by the mirror. This will then reduce the transducer efficiency by a factor of two.

According to a variant of the present disclosure, at least one region, in particular, each of the at least one region, with two or more neighboring electrode means belonging to the same comb electrode comprises an odd number, in particular, only three, of neighboring electrode means belonging to the same comb electrode. Having an odd number neighboring electrode means belonging to the same comb electrode will result in a suppression of one or more electro-acoustic sources within the transducer structure, resulting in a reduction of the electromechanical coupling coefficient $k_s^2$ for the transducer. Since at least two neighboring electrode fingers being connected to the same potential lead to the suppression of one or more electro-acoustic sources in the device, thus less acoustics waves are generated and detected. It becomes therefore possible to control the excitation and detection efficiency of acoustic waves of the transducer structure by suppression of one or more electro-acoustic sources in the transducer structure. Furthermore, since composite substrates or thin bulk substrates are known to lead to parasitic modes in the filter characteristics of a SAW filter device, a reduction in the electrochemical coupling coefficient $k_s^2$ of the transducer structure present in the SAW filter device by suppression of one or more electro-acoustic sources in the transducer structure, should lead to a reduction in the presence or detection of these parasitic modes. It is here possible to reduce the electrochemical coupling coefficient $k_s^2$ in the transducer structure by a factor proportional to the electro-acoustic source density considering the overall transducer length and electrode number of the transducer structure.

According to a variant of the present disclosure, the number of neighboring electrode means belonging to the same comb electrode is different amongst at least two regions with two or more neighboring electrode means belonging to the same comb electrode. Thus, one has further degrees of freedom in the design of the transducer, in particular, to further reduce the electromechanical coupling coefficient $k^2$ of the transducer structure. A reduction in the electromechanical coupling coefficient $k_s^2$ of the transducer structure makes it possible to reduce the presence or at least the detection of the parasitic modes due to the reflected electro-acoustic waves in the substrate in the transducer structure.

According to a variation of the present disclosure, regions with neighboring electrode means belonging to the same comb electrode are provided on both comb electrodes. This will further enhance the possibilities to tailor the transducer structure to the needs.

According to a variation of the present disclosure, the substrate of the surface acoustic wave filter device can be a composite substrate comprising at least a base substrate of a first material and a top layer of a piezoelectric material, in particular, LiTaO₃, in particular, LiTaO₃ with a crystal orientation defined according to standard IEEE 1949 Std-176 as (YXl)/ϑ with 36°<ϑ<52°, more particularly, LiTaO₃ with a 42° Y-cut, X-propagation, defined as (YXl)/42° cut according to standard IEEE 1949 Std-176. Thus, a composite substrate combining materials with temperature stability can be obtained, which makes it possible to further enhance the performance of the SAW devices and gives additional flexibility of design. Furthermore, a large choice of materials for the substrate is available, i.e., substrate materials with a high acoustic wave propagation velocity can be chosen.

According to a variation of the present disclosure, the base substrate comprises Silicon. The base substrate may further comprise a trap-rich layer close to the top layer of piezoelectric material, the trap-rich layer improving the isolation performance of the base substrate and may be formed by at least one of polycrystalline, amorphous, or porous materials such as, for instance, polycrystalline Silicon, amorphous Silicon, or porous Silicon, but the present disclosure is not limited to such materials.

For transferring piezoelectric layers on silicon, mass production methods like SmartCut™, using ion implantation in a piezoelectric source substrate to define a layer to be transferred, attaching the source substrate to a Silicon substrate and transferring the layer by a thermal or mechanical treatment, can be used. Another option would be assembling a piezoelectric source substrate to the base substrate and subsequently perform thinning of the piezoelectric source substrate, in particular, using chemical and/or mechanical treatments. As an alternative base substrates like Diamond, Sapphire or Silicon Carbide could be used.

According to a variation of the present disclosure, the thickness of the piezoelectric layer formed on the base substrate can be larger than one wavelength, in particular, more than 20 μm. As the thickness of the layer influences the frequency of use of the device, it becomes possible to tailor the thickness to a wanted range of frequencies and, for example, to apply SAW devices for filtering high frequencies.

According to a variation of the present disclosure, the material of the base substrate and the piezoelectric material have different temperature coefficient of frequency (TCF), in particular, opposite temperature coefficient of frequency (TCF). A high TCF in a standard piezoelectric substrate leads to a shift in the wavelengths of the passband and leads to an instability in the filter devices. By choosing opposing TCFs between the base substrate and the piezoelectric layer in the composite substrate, it becomes possible to improve the behavior of the transducer as a function of temperature.

According to a variation of the present disclosure, the material of the base substrate has a thermal expansion smaller than the one of the piezoelectric material, in particular, up to ten times smaller, more, in particular, more than ten times smaller. Therefore, the base substrate in the composite substrate can impose the overall thermal expansion of the composite substrate, yielding a TCF reduction of the device. It becomes possible to improve the behavior of the transducer as a function of temperature.

The object of the present disclosure is also achieved with a surface acoustic wave filter device, comprising an acoustic wave propagating substrate and at least one transducer structure as described previously. Thus, the SAW filter device comprises a transducer structure in which the amount of active electro-acoustic sources in its structure and therefore its electrochemical coupling coefficient $k_s^2$ is controlled without departing from the Bragg condition.

In particular, the at least one transducer structure of the SAW filter device can comprise a transducer structure with one or more of features as described above. Thus, the SAW filter device comprises a transducer structure, which allows controlling its electromechanical coupling coefficient $k_s^2$ by the suppression of electro-acoustic sources in its structure. The suppression of electro acoustic sources in the transducer structure leads in turn to the reduction of parasitic signals outside the bandpass of the SAW filter device and more stable filter characteristics with temperature.

According to a variation of the present disclosure, each transducer structure of the surface acoustic wave filter device has the same configuration. This characteristic is particularly critical for impedance element filters requiring all elements behaving in a similar way one another to optimize the filter shape and its out-of-band rejection.

According to a variation of the present disclosure, the filter bandpass of the SAW filter device is narrower than the maximum bandpass achievable for a given mode-substrate couple, in particular, is comprised between 0.1 and 2% for the case of LiTaO₃ (YX/)/42° on (100) Silicon. The filter bandpass of the SAW filter device is modulable depending on the amount of regions of suppression of electro-acoustic sources and their non-periodic or random arrangement in the at least one transducer structure.

As the filter bandpass width Δf is related to the electromechanical coupling coefficient fe², it is therefore possible to vary and control the SAW filter device bandpass by varying the electromechanical coupling coefficient $k_s^2$, without modifying the structural features of the transducer structure, i.e., shape of the electrode means, e.g., the electrode finger width, electrode pitch. Thus, without modifying the fabrication process used by simply adjusting the amount and arraignment of suppressed electro-acoustic sources, it becomes possible to adapt the filter characteristics. Consequently, the control of electromechanical coupling starting from a given value allows for addressing various filter bandwidths without degradation of the other filter feature, such as rejection, phase linearity in the band, insertion losses, etc.

BRIEF DESCRIPTION OF THE DRAWINGS

The present disclosure may be understood by reference to the following description taken in conjunction with the accompanying figures, in which reference numerals identify features of the present disclosure.

DETAILED DESCRIPTION

Figure 1A:
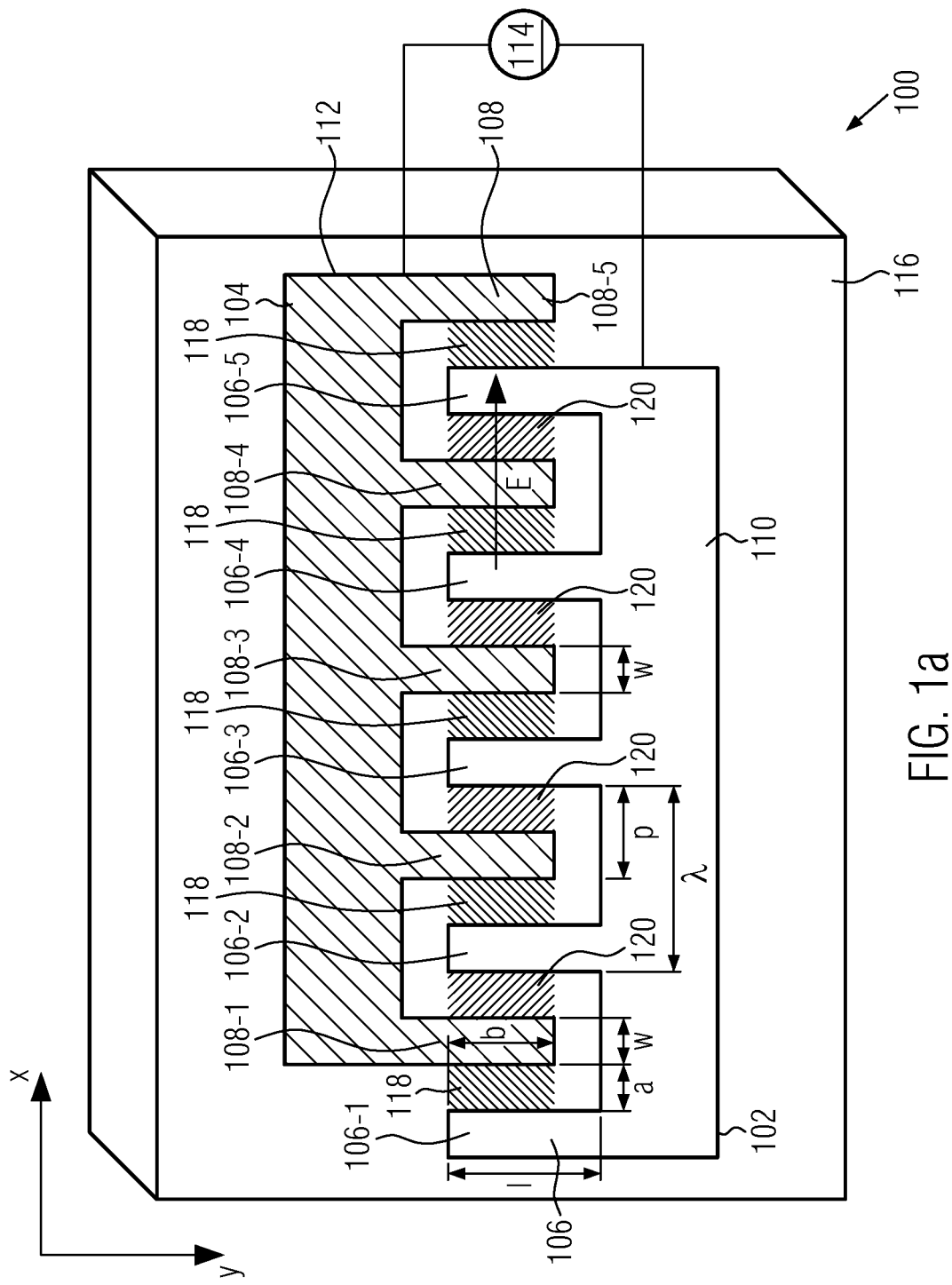
FIG. 1a shows an inter-digitated transducer structure for surface acoustic wave devices according to the state of the art.

In FIG. 1a, a transducer structure 100 according to the state of the art is shown. The transducer structure 100 comprises opposing inter-digitated comb electrodes 102 and 104, each of which has a plurality of electrode fingers, 106 and 108, respectively, extending from a respective conducting portion 110 and 112 and being inter-digitated with each other. The electrodes 102 and 104 and the conducting portions 110 and 112 are formed of any suitable conductive metal, for example, Aluminum or Aluminum alloy.

Notably, transducers generally have a much larger number of electrode fingers than depicted in FIG. 1. The number of actual electrode fingers has been significantly reduced in the drawing figures in an effort to more clearly depict the overall concept.

An electrical load 114 is illustrated as being coupled across the electrodes 102, 104.

However, it will be understood that a source potential 114 may also be coupled across the electrodes 102, 104, depending upon whether the transducer structure 100 is utilized to excite surface acoustic waves in the substrate 116 or to convert received surface acoustic waves to electrical signals, or both.

The transducer structure 100 excites the surface acoustic waves in the electrical field direction, meaning perpendicularly to the extension direction y of the electrode fingers 106, 108 of the electrodes 102, 104, as shown by the arrow E in FIG. 1. The transducer structure 100 can be considered as the sum of electro-acoustic sources corresponding to the zones where the electric field is effectively applied. As the transducer structure is emitting energy on each of its edges, meaning in both directions +X and −X, an electro-acoustic source is considered between any electrode finger having a different potential compared to its neighboring electrode finger. This leads to the definition of an electro-acoustic source being formed by a pair of neighboring electrodes fingers of opposite polarity. Therefore, an electro-acoustic source 118 is present, for example, in between electrode fingers 106_1 and 108_1, being at the alternating potential +V/−V but there will also be an electro-acoustic source 120 present between the electrode fingers 108_1 and 106_2, being at alternating potentials −V/+V. Therefore, in the whole transducer structure of FIG. 1, five electro-acoustic sources 118 are present as well as five electro-acoustic sources 120. The electroacoustic source's 118 or 120 spatial area is defined by the interelectrode distance a, in the propagation direction x of the surface acoustic waves, and the overlap b between the neighboring electrodes fingers 106 and 108 in the transverse direction y, e.g., in FIG. 1a, the neighboring electrodes fingers 106_1 and 108_1.

The frequency of utilization of the transducer structure 100 is defined by $f_r=V/2p$, V being the velocity of the acoustic wave and p, the electrode pitch of the transducer structure 100, as shown in FIG. 1. The electrode pitch p of the transducer is also chosen to be $\lambda/2$, $\lambda$ being the operating wavelength of the surface acoustic wave. Thus, the electrode pitch p defines the frequency of utilization of the transducer structure. The electrode pitch p also corresponds to the edge-to-edge electrode finger distance between two neighboring electrode fingers from opposite comb electrodes 102 and 104, e.g., between 108_2 and 106_3. In this case, the wavelength $\lambda$ is therefore defined as the edge-to-edge electrode finger distance between two neighboring electrode fingers from the same comb electrodes 102 or 104, e.g., between 106_2 and 106_3.

The inter-digitated electrode fingers 106 and 108 typically all have essentially the same length l and width w as well as thickness t.

The inter-digitated electrode fingers 106, 108 are at alternating potentials, wherein the alternating potentials of the inter-digitated electrode fingers 106, 108 can be potentials of opposite polarity, namely +V and −V, or as a mass and a load/source potential $V_{IN}$ (not shown).

The propagation characteristics of the waves produced by the transducer structure 100 include among others propagation velocity, electromechanical coupling coefficient $k_s^2$ and temperature coefficient of frequency (TCF). The propagation velocity affects the relationship between the pitch of the transducer p and the required frequency of the device.

Furthermore, for filter device application and specially ladder filder-type devices, the bandwidth of the filter $\Delta f$ is proportional to the electromechanical coupling coefficient $k_s^2$ considering the empirical relation $\Delta f/f \sim (2/3) k_s^2$, $\Delta f$ corresponding to the bandpass width in frequency of the filter, $f_r$ being the resonant frequency of the transducer structure. The TCF is associated with the influence of a temperature to the frequency changes in filters.

Figure 1B:
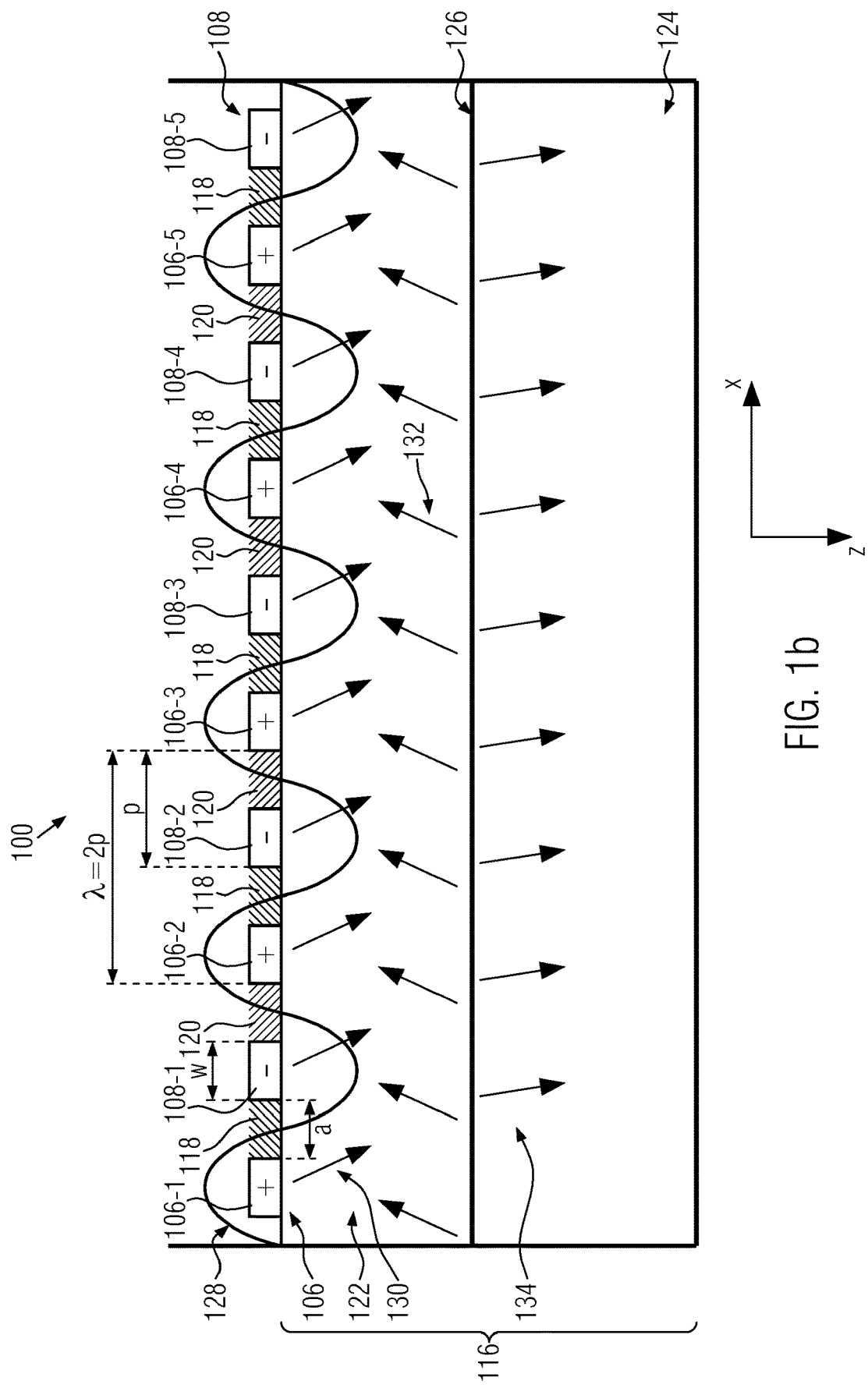
FIG. 1b shows a side view of the inter-digitated transducer structure of FIG. 1a on a composite substrate, and also illustrates the acoustic waves generated and reflected in such structure, according to the state of the art.

FIG. 1b shows the same transducer structure 100 as in FIG. 1a, in a side view, showing the plurality of electrode fingers 106, 108 from the inter-digitated comb electrodes 102 and 104, respectively, (not shown). The substrate 116 on which the transducer structure 100 is provided is a composite substrate 116.

The composite substrate 116 comprises a layer of piezoelectric layer 122 of a certain thickness, formed on top of a base substrate 124. The piezoelectric layer 122 herein described by way of example may be Lithium Niobate (LiNbO$_3$) or Lithium Tantalate (LiTaO$_3$).

The piezoelectric material layer 122 can be attached to the base substrate 124 by direct bonding e.g., using a Smart-Cut™ layer transfer technology. In a variant, a thin SiO$_2$ layer (not shown) can be provided between the piezoelectric layer 122 and the base substrate 124 to improve the attachment. Prior to the direct bonding further processing steps can be added, such as polishing of the side of the piezoelectric layer 122 and/or of the side of the base substrate 124 forming later on the interface 126 between the piezoelectric layer 122 and the base substrate 124.

A composite substrate 116 with a combination of strong coupling, starting from 1% to 25% or even more, and temperature stability due to the combination of materials with different temperature coefficient of frequency (TCF) and high acoustic wave propagation velocity, will enhance the performance of the SAW device.

Like in FIG. 1a, the transducer structure 100 has the electrode pitch p. The inter-digitated electrode fingers 106 and 108 all have essentially the same length l, width w as well as thickness t. Furthermore, the operating frequency $f_r$ is fixed by the condition of phase agreement given by V/2p, V being the velocity of the acoustic wave travelling below the inter-digitated electrodes and p, the electrode pitch of the transducer structure 100. In such condition, the transducer is said to be working in a synchronous mode at the operating frequency $f_r$, where all the excited acoustic waves in the transducer structure are coherent and in phase.

An electroacoustic wave propagating under an electrode grating is sensitive to electrical and mechanical boundary conditions at the surface. On the edges of the electrodes, the impedance breaks, here electrical and mechanical, cause a reflection of part of the energy transported. When all the elementary reflections, i.e., the reflections under each of the electrodes, are in phase, the wave is entirely reflected and thus stopped by the grating. This phenomenon, known as Bragg condition, appears for frequency ranges called "stop bands." There is constructive interference between the reflexions of the wave, also called phase coherence, when $\lambda=2pn$, $\lambda$ being the operating wavelength of the transducer, p being the electrode pitch, and n an integer. The operating wavelength $\lambda$ of the transducer is related to the operating frequency $f_r$, defined previously, as $f_r=V/2p=V/\lambda$.

At the Bragg condition, the Bragg frequency is defined by $\lambda=2p$ (n=1). This type of transducer structure is also called a two finger per wavelength structure and resonates at the Bragg frequency, within the "stop band." The transducer 100 is exactly one of this type of transducer. These structures correspond to an electrical excitation at alternating potential +V, −V, +V, −V . . . and enable to create resonant cavities.

The inter-digitated electrode fingers 106, 108 are at alternating potentials, wherein the alternating potentials of the inter-digitated electrode fingers 106, 108 can be potentials of opposite polarity, namely +V and −V as shown in FIG. 1b, or at mass and a load/source potential $V_{IN}$ (not shown). As shown in FIG. 1b, the electrode finger 106_1 is at a potential +V while its neighboring electrode finger 108_1 is at a potential −V.

Again, the transducer structure 100 can be considered as the sum of electro-acoustic sources 118 and 120 corresponding to the zones where the electric field is effectively applied, which leads to the definition of an electro-acoustic source 118, 120 being formed by a pair of neighboring electrodes fingers at alternating potential, for instance, electrode fingers 106_1 and 108_1 or 108_1 and 106_2, respectively. Its spatial area is defined by the interelectrode finger distance a, in the propagation direction x, and the overlap b between two neighboring electrode fingers 106 and 108 in the transverse direction, i.e., 106_1 and 108_1 or 108_1 and 106_2 as can be seen in FIGS. 1a and 1b.

When an electrical load 114 is coupled across the electrodes 102, 104, surface acoustic waves 128 are excited in the composite substrate 116 and propagate in the direction x, perpendicular to the direction of the electrodes 106, 104. Bulk acoustic waves 130 generated by the transducer structure 100 are also launched into the composite substrate 116 and are reflected at the bonding interface 126 between the piezoelectric layer 122 and the base substrate 124. These reflected acoustic waves 132 are then re-absorbed by the transducer structure 100 and which results in spurious resonance responses generated by the transducer structure 100. These reflected acoustic waves 132 are coherent in phase, as the transducer structure operates in a synchronous mode, meaning that the detection and generation of acoustic waves is synchronous throughout the whole transducer structure.

These bulk acoustic waves 128 are generated at the electro-acoustic sources 118 and 120, at an angle a with the surface of the piezoelectric layer 122. Their effective velocity V depends on the piezoelectric layer 122 and the electrode pitch p of the transducer structure 100 by extension of the well-known behavior of bulk waves excited using inter-digitated transducer, as described in D. Lee, "Excitation and Detection of Surface Skimming Bulk Waves on Rotated Y-Cut Quartz," IEEE Transactions on Sonics and Ultrasonics, Vol. SU-27, N° 1, pp. 22-30, 1980 and also R. F. Milsorn, N. H. C. Reilly, and M. Redwood, "Analysis of generation and detection of surface and bulk acoustic waves by interdigital transducers," IEEE Transactions on Sonics and Ultrasonics, vol. SU-24, pp. 147-166, 1977.

A part of the bulk acoustic waves 134 are not reflected at the interface 126 and propagate deeper into the base substrate 124 in a radiative way when the equivalent propagation velocity overpasses the so-called surface-skimming-bulk-wave (SSBW) limit indicating the maximum velocity at which the substrate is capable to guide waves into the piezoelectric layer.

Figure 2:
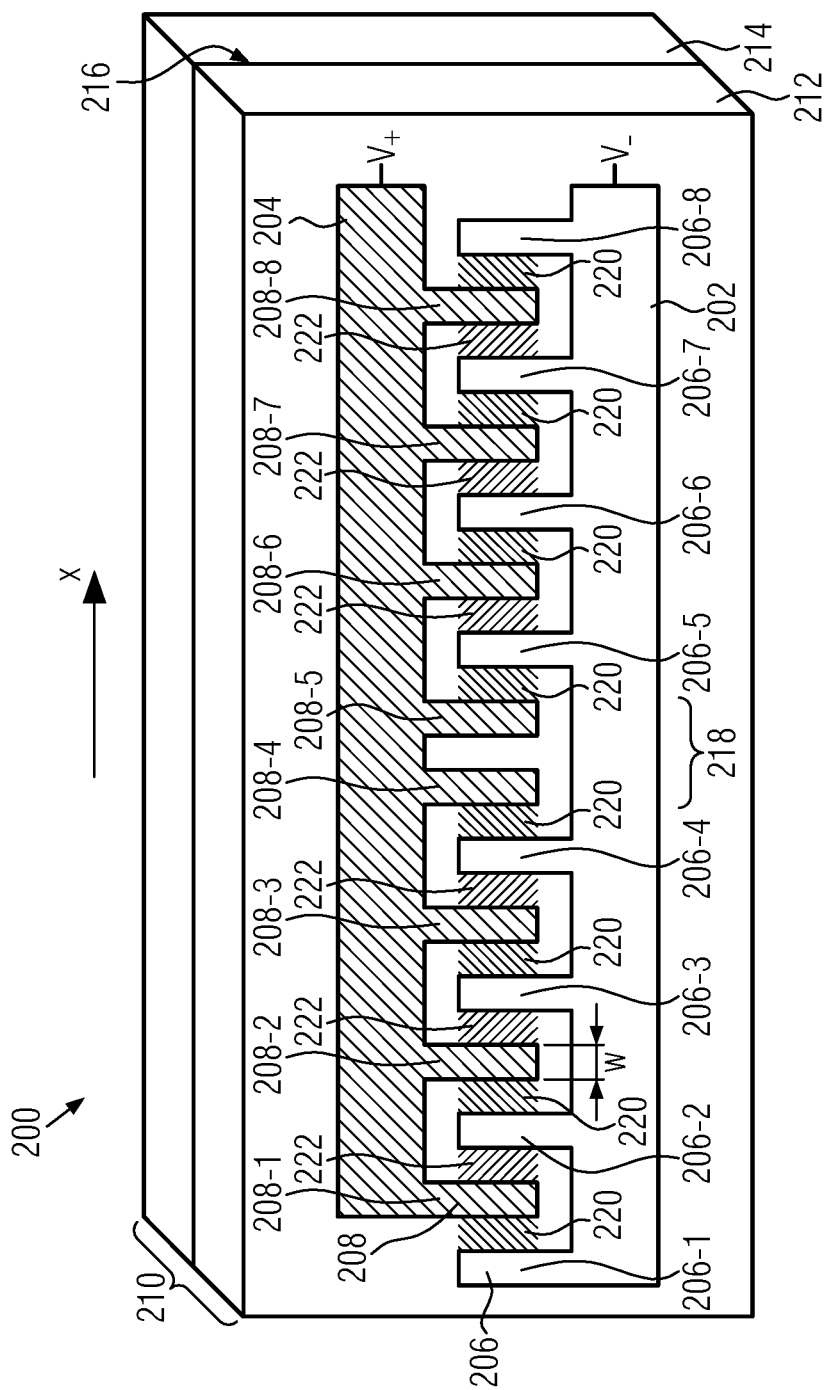
FIG. 2 illustrates schematically an inter-digitated transducer structure for surface acoustic wave devices according to a first embodiment of the present disclosure.

FIG. 2 shows an inter-digitated transducer structure 200 for a surface acoustic wave device according to a first embodiment of the present disclosure. The inter-digitated transducer structure 200 comprises a pair of inter-digitated comb electrodes 202 and 204 each comprising a plurality of electrode means 206 and 208, and formed on a substrate 210.

In this embodiment, the electrode means 206 and 208 have the shape of fingers 206, 208. In a variant of the embodiment, the electrode means could also have spilt fingers 206, 208 comprising each two or more directly adjacent electrode fingers belonging to the same comb electrode.

The composite substrate 210 comprises a layer of a piezoelectric material 212 of a certain thickness, formed on top of a base substrate 214. The piezoelectric layer 212 herein described by way of example may be either Lithium Niobate(LiNbO$_3$), in particular, LiNbO$_3$ with a crystal orientations defined according to standard 1949 Std-176 as (YXl)/∂ with 36°<∂<52° or 60°<∂<68° or 120°<∂<140°, or as (YXt)/Ψ with 85°<Ψ<95°, or as (Yxwlt)/φ∂Ψ with φ=90°, −30°<∂<45° and 0°<Ψ<45° or Lithium Tantalate (LiTaOs), in particular, LiTa03 with a crystal orientation defined according to standard IEEE 1949 Std-176 as (Y X/)/d with 36°<d<52°, more particularly, Uta03 with a 42° Y-cut, X-propagation, defined as (YX/)/42° cut according to standard IEEE 1949 Std-176.

The thickness of the piezoelectric layer 212 formed on the base substrate 214 can be larger than one wavelength, in particular, more than 20 pm. As the thickness of the layer influences the frequency of use of the device, it becomes possible to tailor the thickness to a wanted range of frequencies. In this case the transducers can be used in SAW devices for filtering high frequencies. Indeed, considering a wave velocity of 4000 m/s, the top layer minimum thickness will range from 40 pm to 1 pm for frequencies varying between 100 MHz and 5 GHz. The upper thickness limit is related to the ratio between the thicknesses of the piezoelectric layer 212 and the base substrate 214. The thickness of the base substrate 214 must be larger than the thickness of the piezoelectric layer 212 to impose its thermal expansion to the piezoelectric layer 212 and to reduce the transducers sensitivity to temperature changes. A preferred situation corresponds to a base substrate thickness that is at least ten times larger than the thickness of the piezoelectric layer 212.

The base substrate 214 used in the first embodiment of the present disclosure is a Silicon substrate. Since the temperature expansion coefficient of Si is in the vicinity of 2.6 ppm/° C., while that of 42° XY LiTaO$_3$, noted (YXl)/42° according to standard IEEE 1949 Std-176, is approximately 16 ppm/° C., the combined temperature expansions coefficient on the SAW device will be generally within the range of 2.6 to 16 ppm/° C., depending upon the thickness of the piezoelectric layer 212 and the stress level at the bonding interface 216. The effective lowering of the temperature expansion coefficient of the composite substrate 210 results in a reduced temperature coefficient of frequency (TCF) of the transducer structure 200.

As mentioned previously, by using a different material for the base substrate 214, the flexibility in the design can be enhanced. Instead of Silicon, other substrate materials with a high acoustic wave propagation velocity can be chosen, such as Diamond, Sapphire, Silicon Carbide or even Aluminum Nitride and more generally any material presenting a slow shear bulk wave velocity equal or larger than 4500 m/s. Also, material with smaller thermal expansion than Silicon (some amorphous quartz compositions or pyrex glass or Mica or Silicon Carbide, for instance) may be advantageously used to control the TCF of the resulting filter.

The pair of inter-digitated comb electrodes 202 and 204 comprises a plurality of electrode fingers 206 and 208. The electrode fingers, for example, 206_1, 208_1 to 206_4, 208_4, respectively, and 208_5, 206_7 to 208_8, 206_10 are inter-digitated and are connected to alternating potentials via their comb electrodes 202 and 204. The alternating potential can be +V and −V as illustrated or in a variant a mass and a load/source potential. The electrode fingers are metallic and all have the same length l, width w, and thickness t. Furthermore, an electrode pitch p, defined as λ/2, is used for the transducer structure 200.

According to a variant of the present disclosure, the electrode fingers 206, 208 can also have different length l, width w and thickness t.

The transducer structure 200 further comprises a region 218, where two neighboring electrode fingers 208_4 and 208_5 are connected to the same potential, here +V, without any electrode fingers 206 from the opposing inter-digitated comb electrode 202 inbetween. The two neighboring electrode fingers 208_4 and 208_5 can also be connected to −V, or to mass, or to a load/source potential $V_{IN}$ (not shown).

In the variant where the electrode means 206, 208 are represented by split fingers 206, 208 of two or more adjacent fingers at the same potential, two neighboring electrode means 206, 208 connected to the same potential can refer to all fingers of the split fingers 206, which are connected to the same potential of the split fingers 208. But it could also be that at least one electrode finger of the split fingers 206 is connected to the same potential of the split fingers 208.

In FIG. 2, the region 218 is actually placed in the middle of the transducer structure, so that on each side, left and right, of the region 218, eight electrode fingers or four electrode finger pairs are present. In a variant of the embodiment, the region 218 can be placed at a different position in the transducer structure, so that the electrode finger pairs are distributed not evenly on either side of the region 218. The region 218 can also be placed on either extremity end of the transducer structure 200.

As mentioned previously, the electrode fingers 206_1, 208_1 to 206_4, 208_4, respectively, and 208_5, 206_5 to 208_8, 206_8 are inter-digitated and have alternating potentials. It can actually be seen, that due to the presence of the region 218, on the left side of the region 218, the inter-digitated electrode fingers 206_1, 208_1 to 206_4, 208_4 are at alternating potential −V/+V, respectively, while on the right side of the region 218, the inter-digitated electrode fingers 208_5, 206_5 to 208_8, 206_8 are at alternating potential +V/−V, respectively.

As explained previously, a pair of neighboring electrode fingers connected at alternating potential defines an electro-acoustic source. For example, here in FIG. 2, the neighboring inter-digitated electrode fingers 206_1 and 208_1 at alternating potential −V/+V define an electro-acoustic source 220. But the neighboring inter-digitated electrode fingers 208_1 and 206_2 at alternating potential +V/−V define also an electro-acoustic source 222. Thus, the pair of neighboring inter-digitated electrode fingers 206_2, 208_2 to 206_4, 208_4 each also defines an electro-acoustic source 220 and, respectively, the pair of neighboring inter-digitated electrode fingers 208_2, 206_3 and 208_3, 206_4 each also defines an electro-acoustic source 220. In particular, here, on the left of the region 218, four active electro-acoustic sources 220 and three active electro-acoustic sources 222, with in total eight inter-digitated electrode fingers 206_1, 208_1 to 206_4, 208_4 are present.

On the right side of the region 218, a pair of neighboring inter-digitated electrode fingers, for example, 208_5 and 206_5 connected at alternating potential +V/−V defines also an electro-acoustic source 222, and the pair of neighboring inter-digitated electrode fingers 206_5 and 208_6 at alternating potential −V/+V define an electro-acoustic source 220. On the right side of the region 218, four active electro-acoustic sources 222 and three active electro-acoustic sources 220, with in total eight inter-digitated electrode fingers 208_5, 206_5 to 208_8, 206_8 are present. But here, the electro-acoustic sources 220, 222 on the left side of the region 218 are in opposition of phase with the electro-acoustic sources 222, 220 on the right side of the region 218, in particular, of π.

However, as the electrode pitch p is defined as λ/2, this signifies that the transducer structure is operating in a synchronous mode, at the Bragg condition. Therefore, the plurality of electro-acoustic sources 220, 222 on the left side of the region 218 are all in phase and coherent with each other, while the plurality of electro-acoustic sources 222, 220 on the right side of the region 218 are all in phase and coherent with each other.

In the region 218, there is no electro-acoustic source 220 or 222 between the two neighboring electrode fingers 208_4 and 208_5, as they are both connected to the same potential.

According to a variant, the polarity of the potential could be swapped between the first and second inter-digitated comb electrodes 206 and 208. Or connected to mass on the one comb electrode and a load/source potential $V_{IN}$ on the other comb electrode.

Due to the presence of the second region 218 in the transducer structure 200, the phase of the electro-acoustic sources within the transducer has been inverted by π, as the electro-acoustic sources on the left side of the region 218 are in opposition of phase with the electro-acoustic sources on the right side of the region 218. Thus, destructive interference is created between the electro-acoustic sources in the transducer by combining the energy emitted from each side of the two electrode fingers connected to the same comb electrode toward the transducer, whereas the energy emitted toward the outside of the transducer will actually be launched and reflected by the mirror, positioned on either side of the transducer structure in a SAW device.

Therefore the amount of electro-acoustic sources present in the transducer structure 200 being coherent and in phase in the transducer structure 200 is reduced compared to a transducer structure of the state of the art of the same size, where all the electrode fingers are at alternating potentials, as shown in FIG. 1. As a consequence, the electrochemical coupling coefficient $k_s^2$ in the transducer structure has been reduced.

Here, in this particular embodiment, the left and right side of the region 218 in the transducer structure 200 have exactly the same number of inter-digitated electrode fingers 206 and 208, namely eight, resulting in seven active electro-acoustic sources, as the region 218 is located in the middle of the transducer structure 200. Here, the electrochemical coupling coefficient $k_s^2$ in the transducer structure 200 is reduced by a factor 2. Again, as destructive interference are created between the electro-acoustic sources in the transducer structure, by combining the energy emitted from each side of the two electrode fingers connected to the same comb electrode toward the transducer, whereas the energy emitted toward the outside of the transducer will actually be launched and reflected by the mirror. The transducer efficiency is therefore reduced by a factor of two.

Furthermore, the possibility of phase coherence of the modes being reflected at the interface 216 of the composite substrate 210 is also modified compared to the prior art situation. If the phase is shifted within the transducer structure, there is no chance to detect waves, which do not match the phase matching condition. Therefore, there is a reduction in detection of the reflected acoustic waves from the interface 216, which will in turn lead to a reduction of the parasitic resonances at unwanted frequencies due to these reflections in the filter performance of a SAW device based on a transducer structure 200.

Therefore, the generation and/or detection of acoustic waves in the transducer structure 200 according to the present disclosure is controlled by the amount of electro-acoustic sources in phase present in the transducer structure 200. By having two neighboring electrode fingers connected to the same potential results in a phase change of π within the structure, which has a positive influence on the efficiency of the transducer structure to reject parasitic modes. It is not needed to vary the dimensions of the transducer, such as width or length or inter-electrode distance of the electrode fingers, which would have an impact on the fabrication technology of such structures and might significantly reduce the quality of the resonance of a resonator exploiting the above described transducer structures.

According to a variant of the first embodiment, more than just one region 218 could be present in the transducer structure, therefore increasing the number of suppressed electro-acoustic sources in the transducer structure and thereby decreasing the electromechanical coupling coefficient $k_s^2$ further. This is an efficient way to control the bandwidth of the filter, thus giving more degree of freedom to address various filter bands.

Figure 3:
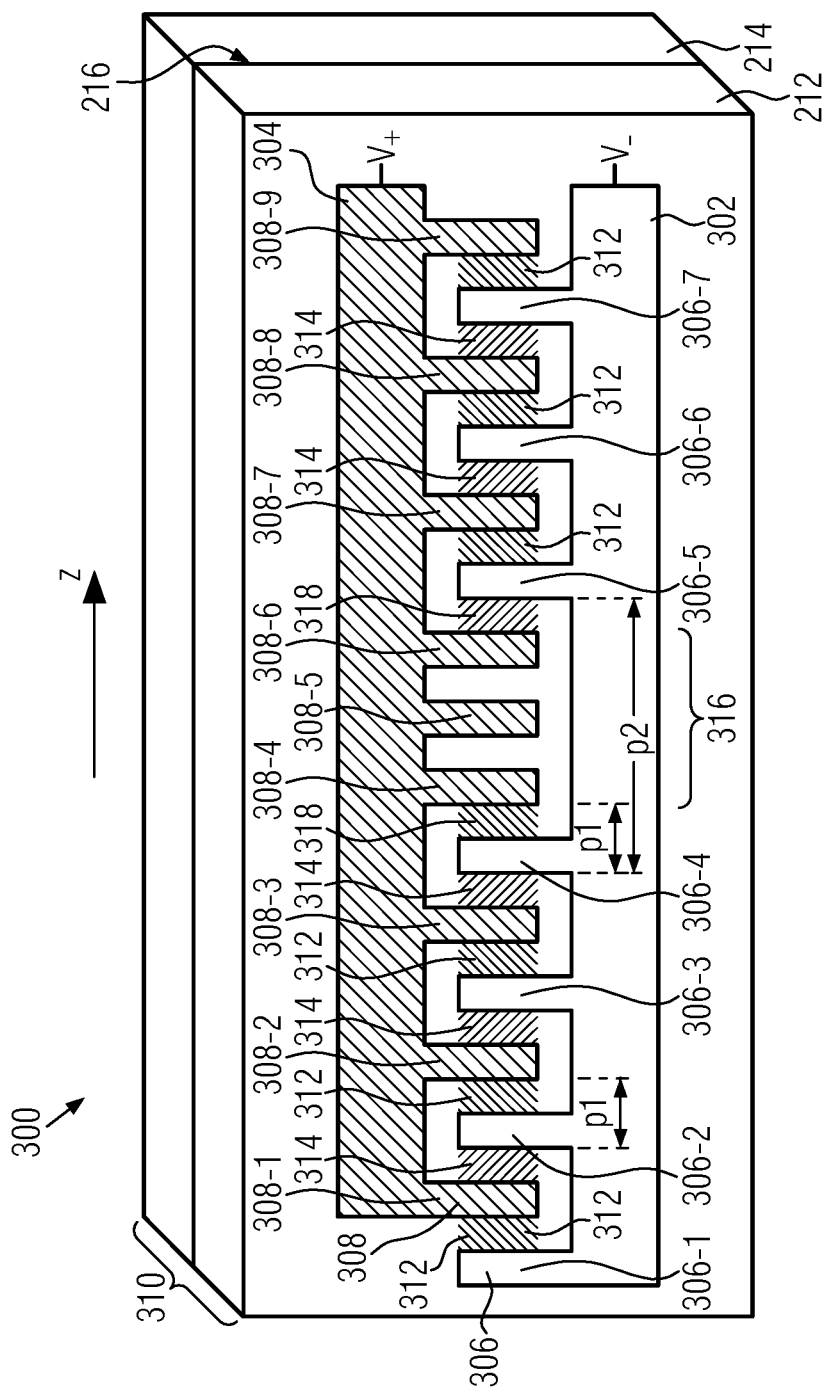
FIG. 3 illustrates schematically an inter-digitated transducer structure for surface acoustic wave devices according to a second embodiment of the present disclosure.

FIG. 3 schematically represents a transducer structure 300 according to a second embodiment. Compared to the first embodiment, the transducer structure 300 has a different arrangement of the pair of inter-digitated comb electrodes 302 and 304 in comparison to the inter-digitated comb electrodes 202 and 204 of the transducer structure 200 of the first embodiment. In this embodiment, the region 316 with adjacent electrode means connected to comb electrode 304 has three adjacent electrode means 308_4, 308_5 and 308_6.

The inter-digitated transducer structure 300 comprises a pair of inter-digitated comb electrodes 302 and 304 each comprising a plurality of electrode means 306 and 308 formed on a substrate 310.

The substrate 310 is the same as the substrate 210 of the first embodiment and it features will therefore not be described in detail again, but reference is made to its description above.

The electrode means 306 and 308 in the second embodiment have the form of electrode fingers 306, 308 like in the first embodiment. In a variant, the electrode means could also have the form of spilt fingers 306, 308 comprising each two or more directly adjacent electrode fingers connected to their respective comb electrode.

Like in the first embodiment, all the electrode fingers 306 and 308 of the transducer structure 300 are metallic and all have the same length l, width w and thickness t.

Again, according to a variant of the second embodiment, the electrode means 306, 308 could also vary in dimensions, having different length l, width w and thickness t.

The neighboring inter-digitated electrode fingers 306_1 and 308_1 at alternating potential −V/+V form an electro-acoustic source 312, like electro-acoustic source 220 in the first embodiment, and the neighboring inter-digitated electrode fingers 308_1 and 306_2 at alternating potential +V/−V form an electro-acoustic source 314, like electro-acoustic source 222 in the first embodiment. Also the pairs of neighboring inter-digitated electrode fingers 306_2, 308_2 to 306_4, 308_4 and 306_5, 308_7 to 306_7, 308_9 each form an electro-acoustic source 312, while the pairs of neighboring inter-digitated electrode fingers 308_2, 306_3 and 308_3, 306_4 and 308_6, 306_5 to 308_8, 306_7 each form an electro-acoustic source 314. Instead of an alternating potential −V and +V one comb electrode could be at the mass, or the comb electrodes could be connected to a load/source potential $V_{IN}$ (not shown).

The transducer structure is defined by its pitch p, defined as the edge-to-edge electrode finger distance between two neighboring electrode fingers from opposite comb electrodes 302 and 304, e.g., between 306_2 and 308_2. The transducer structure 300 according to the second embodiment also operates at the Bragg resonant conditions as $\lambda_1 = 2p_1$, as in the first embodiment of the present disclosure. Therefore, all the electro-acoustic sources 312 present in the transducer structure 300 are in phase and coherent, as the transducer structure 300 operates in a synchronous mode.

Unlike the first embodiment, the transducer structure 300 comprises a region 316, with three neighboring electrode fingers 308_4 to 308_6 at the same potential +V without any electrode fingers 306 from the opposing inter-digitated comb electrode 302 in between. According to variants, the three neighboring electrode fingers 308_4 to 308_6 can also be connected to −V, or to mass, or to a load/source potential VIN (not shown).

In the region 316, by connecting three neighboring electrode fingers 308_4 to 308_6 at the same potential +V, without an electrode finger 306 from the opposite comb electrode 302 in between, electro-acoustic sources 312 have been suppressed in the region 316.

However, as the electrode finger 308_4 of region 316, being at a potential +V is located next to an electrode finger 306_4 at a potential −V, an electro-acoustic source 318 will be present between these two neighboring electrode fingers 308_4 and 306_4, but being defined by a pitch $p_2$, as shown in FIG. 3. The pitch $p_2$ is actually bigger than the pitch pi of the transducer structure.

In a variant of the embodiment, the region 316 can be placed at another position in the transducer structure 300. The region 316 can also be placed on either extremity end of the transducer structure 300.

The region 316 in the transducer structure 300 results in an electrode pitch $p_2$, different than the electrode pitch $p_1$ of the rest of the transducer structure 300. The electrode pitch $p_1$ defines the resonant frequency of the transducer structure, while the pitch $p_2$ of the region 316 controls the coupling strength of the transducer structure 300. The pitch $p_2$ gives a wavelength $\lambda_2$ being defined as the edge-to-edge electrode finger distance between two neighboring electrode fingers from the same comb electrode 302 or 304, e.g., here between 306_4 and 306_5. As electro-acoustic sources have been suppressed in the region 316, it is said that the number of active electrode fingers 308 in region 316 is reduced compared to the prior art configuration where each electrode finger is active.

An electrode finger is defined as active when forming an electro-acoustic source with another electrode finger of an opposite comb electrode.

With the transducer structure 300 illustrated, the electromechanical coupling coefficient $k_s^2$ is reduced compared to the electromechanical coupling coefficient $k_s^2$ of a transducer structure of the prior art as illustrated in FIG. 1, due to the fact the region 316 results in the presence of a pitch $p_2$ in the transducer structure, larger compared to the pitch $p_1$ of the rest of the transducer structure 300. As stated previously, a larger pitch $p_2$ relates to a larger wavelength $\lambda_2$, and therefore a reduced resonant frequency $f_{r2}$ and a reduced electromechanical coupling coefficient $k_s^2$, as $\Delta f/f \sim (2/3) k_s^2$.

In the region 316, electro-acoustic waves are being generated at both wavelength $\lambda_1$ and $\lambda_2$, therefore at both resonant frequencies $f_{r1}$ and $f_{r2}$. This corresponds to the appearance of coherent modes at a lower frequency $f_{r2}$, called sub-harmonics compared to a transducer structure with alternating electrodes as shown in FIG. 1. Furthermore, due to the suppression of sources, less electro-acoustic waves at $f_{r1}$ is generated compared to a transducer structure of the state of the art with all the electrode fingers being active, e.g., forming a source and with the same amount of electrode fingers in the structure.

The electro-acoustic waves generated by the electro-acoustic sources 312 and 314 at a resonant frequency $f_{r1}$ in the transducer structure 300 are launched into the composite substrate 310 and are being reflected at the bonding interface 216 between the piezoelectric layer 212 and the base substrate 210, like in the first embodiment. But in the transducer structure 300, part of these reflected acoustic waves will actually not be re-absorbed in the region 316 of the transducer structure 300. Furthermore, the electro-acoustic waves generated at a resonant frequency $f_{r2}$ by the electro-acoustic source 318 are not synchronous with the rest of the electro-acoustic waves generated by the electro-acoustic sources 312 and 314, so that their reflected part will also not be re-absorbed by the rest of the transducer structure 300.

As a consequence of the suppression of sources in the region 316 of the transducer structure 300, less acoustic waves are generated at a frequency $f_{r1}$ given by $f_{r1} = V/p1$ and less reflected acoustic waves generated by the transducer structure 300 will be re-absorbed by the transducer structure 300 and therefore less parasitic effect will be observed from such transducer structure when used in SAW filter devices.

The use of a source suppression structure in the transducer structure 300 results in the reduction of the generation and detection of reflected acoustic-waves obtained in the transducer structure, due to a distribution of the reflected acoustic waves over a plurality (e.g., a large number) of frequencies, here e.g., $f_{r1}$ and $f_{r2}$, so as to reduce their amplitude and effect. This in turn leads to a reduction in the parasitic resonances for such transducer structure.

Figure 4:
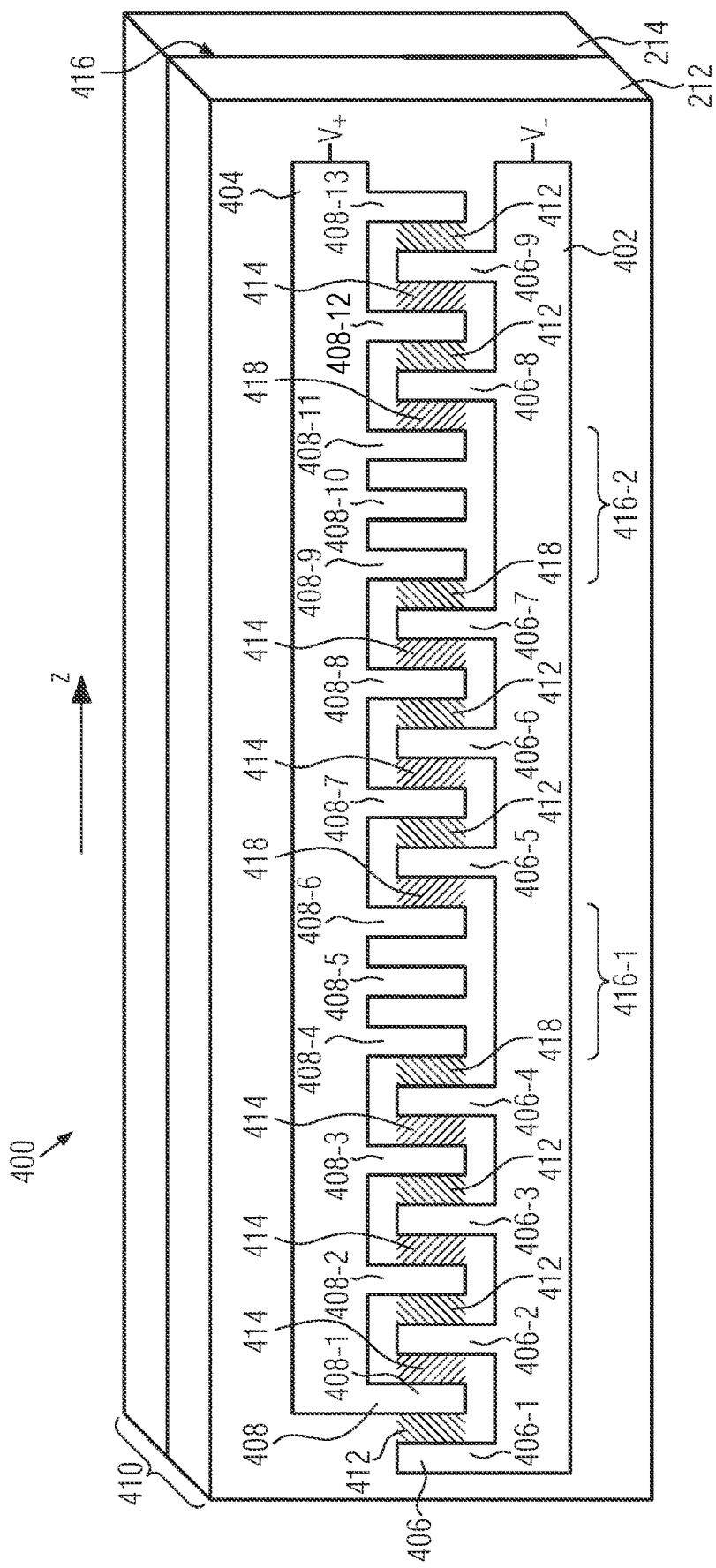
FIG. 4 shows an inter-digitated transducer structure for surface acoustic wave devices according to a third embodiment of the present disclosure.

A transducer structure 400 according to a third embodiment of the present disclosure is schematically illustrated in FIG. 4.

The transducer structure 400 comprises a pair of inter-digitated comb electrodes 402 and 404 with a plurality of electrode means 406 and 408, on a substrate 410, with a plurality of regions 316 compared to the second embodiment, which is the only difference with respect to the second embodiment. The arrangement of the regions 316 is non periodic. All other features are the same and will therefore not be described in detail again but reference is made to their description above.

The electrode means 406 and 408 are electrode fingers or split fingers 406 and 408 like in the first and second embodiments.

The substrate 410 has the same properties as the substrate 210 or 310 of the first and second embodiments.

The transducer structure 400 comprises a plurality of electrode fingers 406_1 to 406_3 and 408_1 to 408_3, wherein the pair of inter-digitated electrode fingers 406_1, 408_1 to 406_3, 408_3 have alternated potentials like in the first and second embodiments. It can be seen that a plurality of electro-acoustic sources 414 and 416, like in the first and second embodiments, are present in the transducer structure 400, defined by a pair of neighboring electrode fingers at alternating potential −V/+V or +V/−V, e.g., 406_1 and 408_1 and 408_1 and 406_2, respectively.

Unlike the first and second embodiments, the transducer structure 400 comprises two regions 416 (416_1, 416_2) with electrode fingers 406, 408, so that the comb electrode 404 has three neighboring electrode fingers 408_4 to 408_6 and 408_9 to 408_112 at the same potential +V without any electrode fingers 406 from the opposing inter-digitated comb electrode 402 in between. The three neighboring electrode fingers 408_4 to 408_6 and 408_9 to 408_11 can also be connected to −V, or to mass, or to a load/source potential $V_{IN}$ (not shown).

Therefore, like in the second embodiment, in each region 416, by connecting three neighboring electrode fingers 408_4 to 408_6 and 408_9 to 408_11 at the same potential −V, without an electrode finger 406 from the opposite comb electrode 402 in between, electro-acoustic source have been suppressed.

However, like in the second embodiment, an electro-acoustic source 418 will be present between neighboring electrode fingers 406_4 and 408_4 and 408_6 and 406_5, but being defined by a pitch $p_2$, as shown in FIG. 4. The pitch $p_2$ is actually larger than the pitch pi of the transducer structure 400. And for region 416_2, an electro-acoustic source 418 will be present between neighboring electrode fingers 406_7 and 408_9 and also 408_11 and 406_8, also defined by the pitch $p_2$.

In this variant, the regions 416_1 and 416_2 have the same configuration of neighboring electrode fingers at the same potential, namely three. According to other variants, the number of neighboring electrode fingers at the same potential could also vary from one to the other, e.g., by having more than three electrode fingers at the same potential next to each other. This would result in a larger reduction in electromechanical coupling coefficient $k_s^2$.

According to a variant, the polarity of the potential could be swapped between the first and second inter-digitated comb electrodes 402 and 404, or the potential could connected to mass on the one comb electrode and a load/source potential VIN on the other comb electrode.

In this embodiment, the regions 416 are non-periodically or randomly distributed along the transducer structure 400, in the propagation direction x. The second region 416_1 is separated from the second region 416_2 by three inter-digitated electrode fingers pairs. According to a variant, the regions 416 can be distributed next to each other along the transducer structure in the propagation direction x.

Like in the second embodiment, the use of a plurality of electro-acoustic source suppression structures 416 in the transducer structure 400 results in the appearance of coherent modes at lower frequencies, namely here $f_{r2}$, called sub-harmonics compared to a transducer structure with alternating electrodes as shown in FIG. 1. The non-periodic or random distribution of the regions 416 along the transducer structure 400 helps in reducing the phase coherence at low frequencies and thereby can reduce the rattle effect observed in a filter device using such a transducer structure.

Like in the second embodiment, the electro-acoustic waves generated by the electro-acoustic sources 412, 414 and 418 of the transducer structure 400 are launched into the composite substrate 410 and are reflected at the bonding interface 216 between the piezoelectric layer 212 and the base substrate 210.

As a consequence of the suppression of sources in the transducer structure 400, less acoustic waves are generated by the electro-acoustic sources 412, 414 at a frequency $f_{r1}$ given by $f_{r1}=V/p1$ and less reflected acoustic waves generated by the transducer structure 400 will be re absorbed by the transducer structure 400 and therefore less parasitic effect will be observed from such transducer structure when used in a SAW filter device.

As in the first and second embodiment, the reflected waves generated from electro-acoustic sources 412, 414, at a frequency $f_1$, will not be re-absorbed by the electro-acoustic sources 418, present due to the regions 416 in the transducer structure. In this embodiment, furthermore, like in the second embodiment, the reflected waves generated by the electro-acoustic sources 418, at a different frequency $f_2$, will also not or less be re-absorbed by the electro-acoustic sources 412, 414 of the transducer structure 400. All in all, a reduction in the generation and detection of reflected acoustic-waves is obtained in the transducer structure 400, due to a distribution of the reflected acoustic waves over a plurality (e.g., a large number) of frequencies so as to reduce their amplitude and effect. This in turn leads to a reduction in the parasitic resonances for such transducer structure.

In this embodiment, two regions 416 are illustrated in the transducer structure 400. According to a variant, more than two regions 416 can be present in the transducer structure 400. As described above, by using a plurality of suppression of electro-acoustic source regions in a transducer structure 400 of a SAW device produced on a composite substrate 410, the surface wave propagation characteristics of the SAW device may be maintained essentially unchanged (e.g., frequency of resonance given by the electrode pitch p), while the parasitic bulk wave propagation characteristics are reduced due to a reduced electromechanical coupling coefficient $k_s^2$.

According to a variant, there could also comprise a combination of regions illustrated in FIGS. 2 and 3, thus one or more regions with an odd number and one or more regions with an even number of neighboring electrodes connected to the same comb electrode.

Figure 5A:
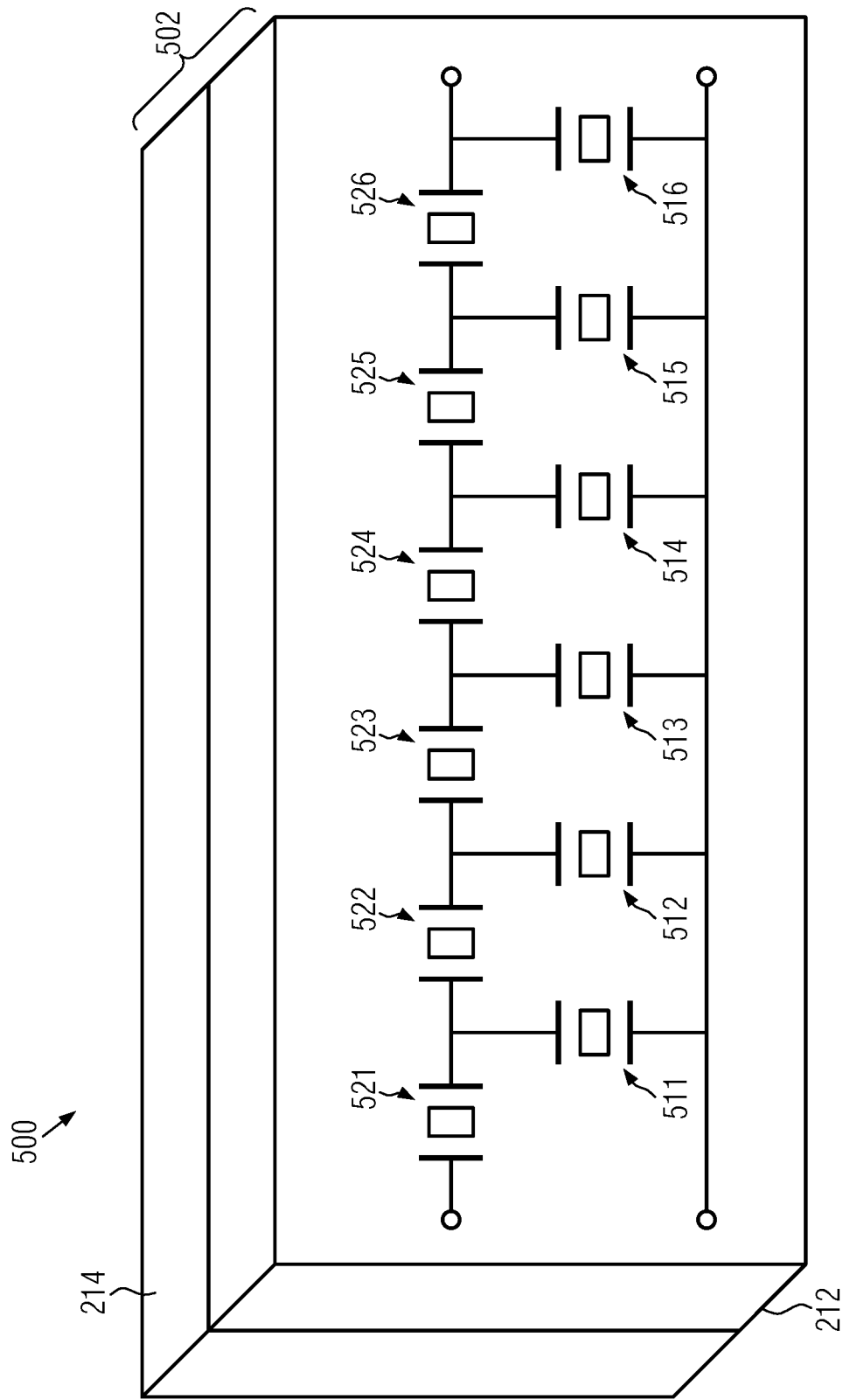
FIG. 5a shows a practical example of a SAW filter device being a ladder type filter device, comprising six resonators in parallel and six resonators in series, as an example of a surface acoustic wave filter device.

FIG. 5a schematically illustrates a SAW filter device 500 according to a fourth embodiment of the present disclosure. The SAW filter device 500 comprises a composite substrate 502 and twelve resonators 511 to 516 and 521 to 526. The composite substrate 502 comprises a base substrate and a top layer and has the same properties as in the previous embodiments, e.g., the substrate 210 with the base substrate 214 and top piezoelectric layer 212 already described with respect to the first embodiment of the present disclosure to the description of which reference is made to.

In this embodiment, the SAW filter device 500 is a ladder filter, comprising a cascade of resonators in parallel and series. The principle of the filter consists of cascading impedance element cells, which could be of so-called L, T or P type according to their actual shape.

According to a variant, the SAW filter device could be another type of filter device, e.g., a balanced bridge type filter device. Actually any SAW filter device can be considered as long as they comprise resonators according to one of the embodiments 1 to 3 or their combination.

In this embodiment, each resonator 511 to 516 and 521 to 526 comprises a transducer structure and two reflectors, the transducer structure being placed between the two reflectors. At least one transducer of the twelve transducers can be realized according to one of the transducer structures 200, 300, 400 according to embodiments one to three as illustrated in FIGS. 2 to 4. Their features will not be described again in detail, but reference is made to their description. The twelve transducers are designed such that their electromechanical coupling coefficient $k_s^2$ is essentially the same, but their structure can be different, notably to adjust resonance and anti-resonance frequencies for shaping the filter response properly, as described hereafter.

The resonators 511 to 516 are placed in parallel while the resonators 521 to 526 are placed in series.

In such a filter, the resonance of the series resonators 521 to 526 is matched with the anti-resonance of the parallel resonators 511 to 516 in the center of the bandwidth, so as to ensure a maximum of transmission around the central frequency. At the frequencies corresponding to the resonance of the parallel resonators 511 to 516, respectively, the anti-resonance of the resonator series 521 to 526, the transmission is almost zero, which makes it possible to design filtering functions with narrow transition bands and strong rejection.

Like already mentioned, in a SAW filter device of the prior art, electroacoustic waves generated by the transducer structure travel in the volume of the piezoelectric layer and are reflected at the interface with the base substrate. These reflected waves disturb the filter characteristics of the SAW device leading to the so called "rattle effect" outside of the bandpass of the filter, thereby reducing the performance of the device.

The transducer structures and the SAW device according to the present disclosure reduce the amount of electroacoustic waves generated to thereby reduce the amount of electroacoustic waves being reflected at the interface between the piezoelectric layer and the base substrate. This is enabled by removing electro-acoustic sources and reducing the electromechanical coupling of the transducer structure. This reduction in electromechanical coupling of the transducer structure corresponds to an artificial increase in the static capacitance of the transducer at a constant dynamic capacitance (or vice-versa).

In addition, by using a piezoelectric material with a strong electromechanical coupling, such as $LiTaO_3$ or $LiNbO_3$ with electromechanical coupling coefficient in the range from 0.92 to 20% and even more, in combination with a transducer structure 200, 300, 400 according to one of embodiments 1 to 3 of the present disclosure, a SAW filter device 500 fabricated on a composite substrate 502 can exhibit both better temperature stability and improved filter characteristics of the bandpass compared to a prior art transducer structure. In particular, SAW filter devices 500 with a relative filter bandwidth between 0.1 and 2% can be achieved.

Figure 5B:
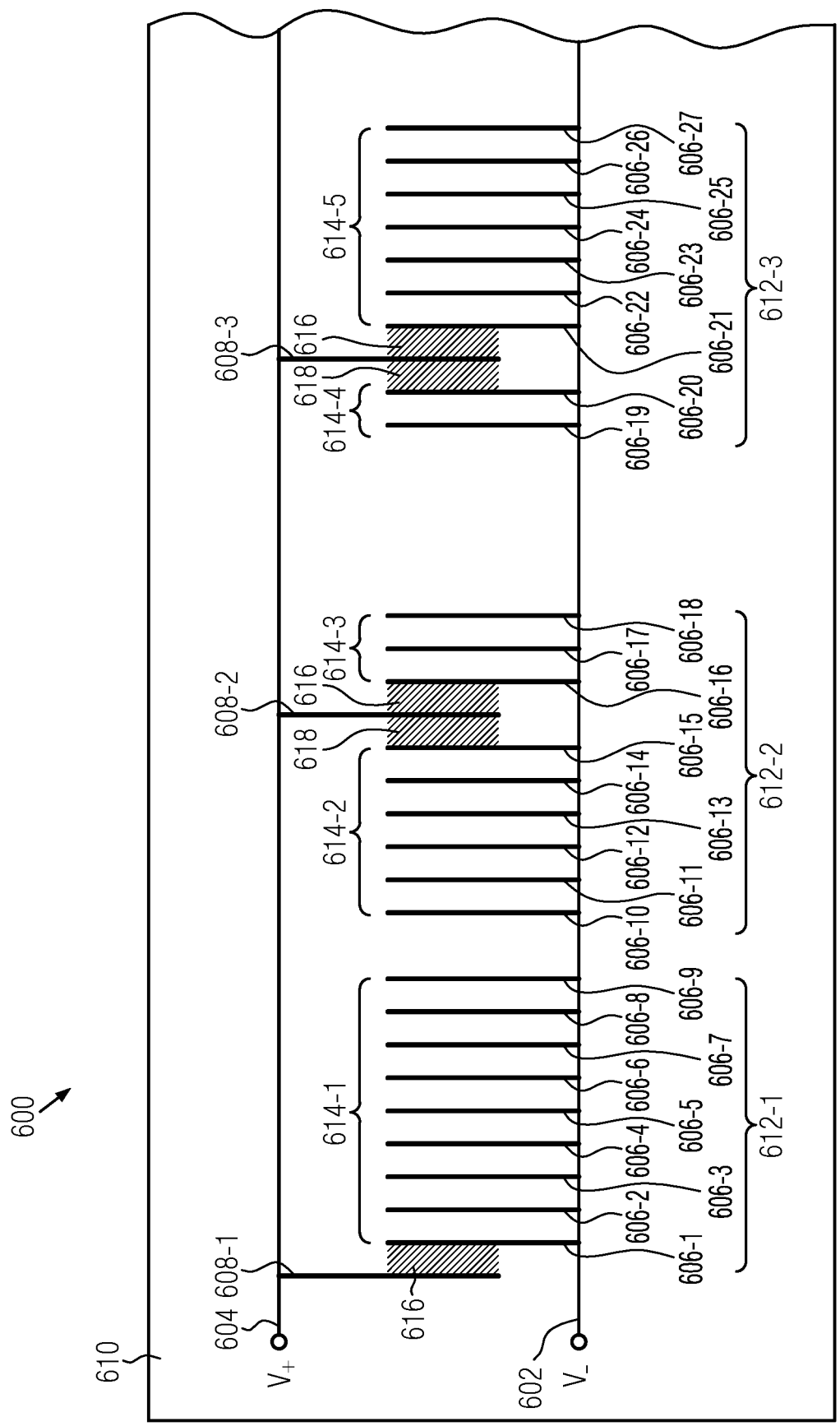
FIG. 5b shows a practical example of an inter-digitated transducer structure for the surface acoustic wave device of FIG. 5a, according to a fourth embodiment of the present disclosure.

FIG. 5*b* schematically illustrates a practical example of a transducer structure 600 used as transducer in the SAW filter device 500 illustrated in FIG. 5*a*.

The transducer structure 600 comprises a pair of inter-digitated comb electrodes 602 and 604 with a plurality of electrode means 606 and 608, here fingers on a substrate 610.

The composite substrate 610 is a Lithium Tantalate (LiTaOs) layer with a 42° Y-cut, X-propagation, also noted (YX/)/42° along the standard IEEE 1949 Std-176, provided on a base substrate of Silicon. The LiTaO3 has a thickness of 20 pm.

In the transducer structure 600, a meta-period 612 can be defined as $\Lambda=4\lambda=8p$, p being the electrode pitch of the transducer structure 600. A total of ten comb electrode fingers 604, 608 are therefore present in the meta-period 612. The transducer structure 600 comprises in total seven meta-periods 612, but only three of them, 612_1, 612_2 and 612_3 are illustrated in FIG. 5*b*.

Each of the seven meta-periods of the transducer structure 600 comprises a suppression of electro-acoustic sources, due to the presence of at least one region 614 with a plurality of electrode fingers connected at the same potential in each of them. The transducer structure shows a non-periodic configuration of the suppression of sources within its structure, as each of the meta-periods shown in FIG. 5*b* comprises a different suppression of sources structure.

In the meta_period 612_1, a region 614_1 comprises nine electrode fingers 606_1 to 606_9 at the same potential −V, without any electrode finger 608 from the opposing inter-digitated comb electrode 604 in between electrode fingers 606_1 to 606_9. Only one electro-acoustic source 616 is present in the meta-period 612_1, between the electrode finger 608_1 connected at +V and the electrode finger 606_1 connected at −V.

In the meta_period 612_2, two region 614_2 and 614_3 comprising six electrode fingers 606_10 to 606_15 and three electrode fingers 606_16 to 606_18 at the same potential −V, without any electrode finger 608 from the opposing inter-digitated comb electrode 604 in between electrode fingers 606_10 to 606_15 and in between electrode fingers 606_16 to 606_18. Only one electrode finger 608_2 connected at +V is present between the electrode fingers 606_15 and 606_16, so that two electro-acoustic sources 616 and 618 are present in the meta_period 612_2.

In the meta_period 612_3, two regions 614_4 and 614_5 comprising, respectively, two electrode fingers 606_19 and 606_20 and seven electrode fingers 606_21 to 606_27 at the same potential −V, without any electrode finger 608 from the opposing inter-digitated comb electrode 604 in between electrode fingers 606_19 and 606_20 and in between electrode fingers 606_21 to 606_27. Only one electrode finger 608_3 connected at +V is present between the electrode fingers 606_20 and 606_21, so that two electro-acoustic sources 616 and 618 are present in themeta_period 612_3.

Compared to a transducer structure 100 where all electrode fingers are at alternating potential, as shown in FIG. 1, in this embodiment, the non-periodic combination of regions 614_1 to 614_4 as shown in FIG. 5*b* results in a suppression of electro-acoustic sources, which in turn results in a reduction of the electromechanical coupling coefficient $k_s^2$.

Figure 5C:
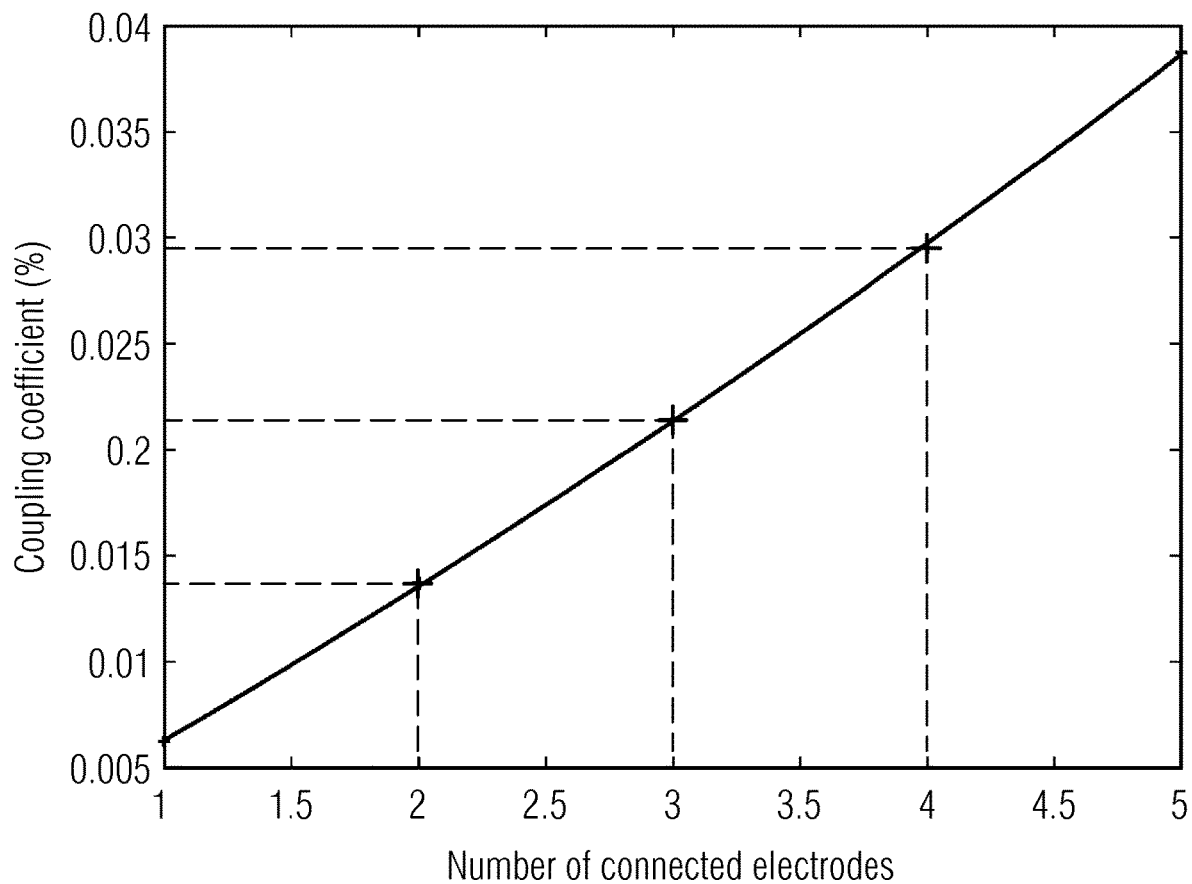
FIG. 5c shows a plot of the variation of the electromechanical coupling coefficient $k_s^2$, with the number of electrode fingers connected within the inter-digitated transducer structure of FIG. 5b, according to the fourth embodiment.

FIG. 5*c* shows how the electromechanical coupling coefficient $k_s^2$, plotted on the Y axis, varies with the number of electrode fingers connected, also called active electrode fingers within the transducer structure, plotted on the X axis. Three experimental values of the electromechanical coupling coefficient $k_s^2$ are plotted for a number of connected electrodes corresponding to 2, 3 and 4, corresponding to electromechanical coupling coefficient $f$ values of 0.014%, 0.022% and 0.03%, respectively. The straight line drawn on the graph corresponds to the theoretical fit of the experimental data using the polynomial equation: $f(x)=aX^2+bX+c$ (%).

It can be seen that for a transducer structure 600, with only two neighboring electrode fingers of the ten electrode fingers present in the meta-period being connected to alternating potential, an electromechanical coupling coefficient $k_s^2$ of the order of 1.4% can be obtained. This corresponds to a meta-period with only one pair of neighboring electrode fingers being connected to alternating potential.

When increasing the number of electrode fingers of the meta-period being connected, it can be seen that the increase in electromechanical coupling coefficient $k_s^2$ is linear. For five pairs of electrode fingers of the meta-period being connected to alternating potential, corresponding to a state of the art transducer structure, like transducer structure 100, an electromechanical coupling coefficient $k_s^2$ of 3.8% is obtained.

Figure 5D:
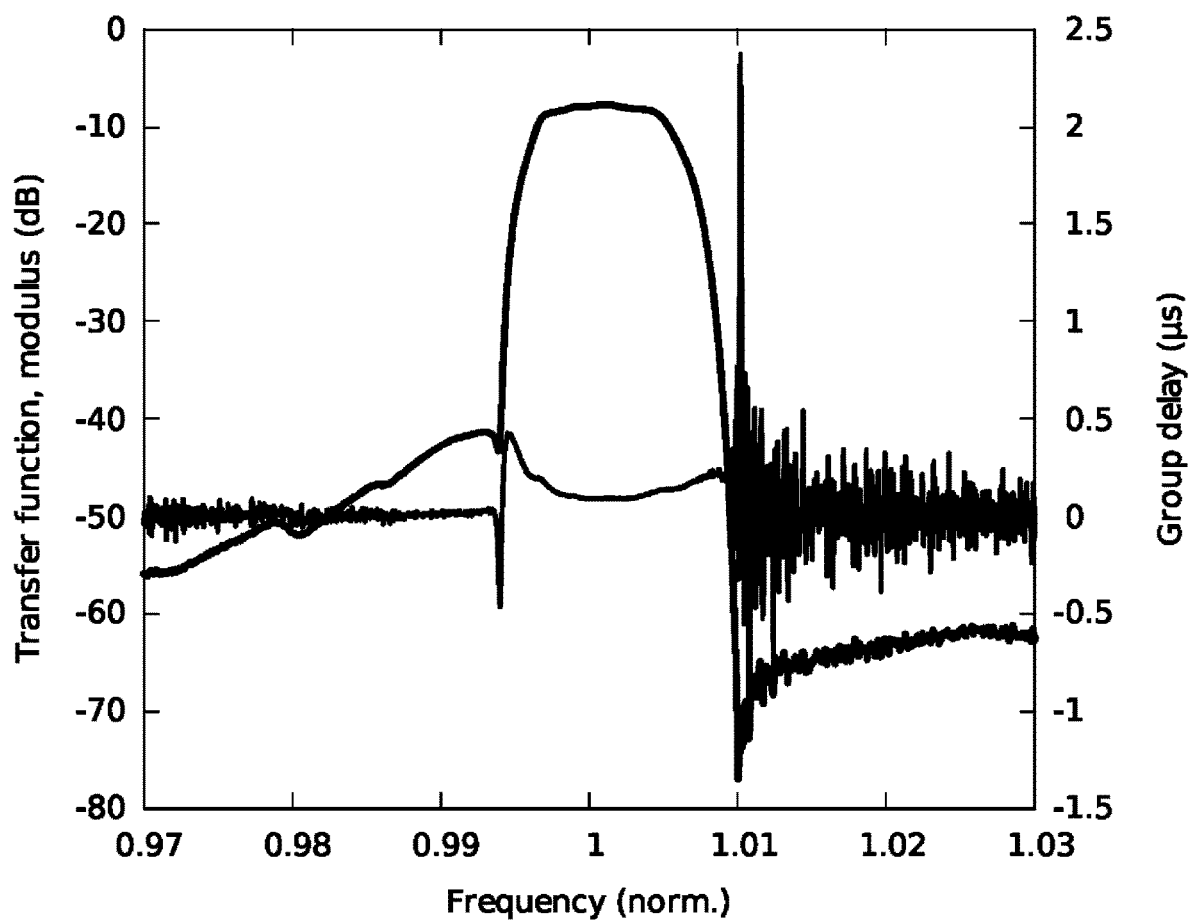
FIG. 5d illustrates the SAW filter device characteristics for the SAW filter device of FIG. 5a, using the transducer structure of FIG. 5b.

With the transducer structure 600, a SAW filter device as illustrated in FIG. 5*a* with a relative filter bandwidth of 0.65%o and 0.4%, and a bandwidth loss lower than 6 dB is obtained. This is illustrated in FIG. 5*d* tracing the modulus of the transfer function on the left Y axis over the normalized frequency on the X axis, corresponding to the thick black line, while the group delay in μs is plotted on the right Y axis, corresponding to the thin black line in FIG. 5d.

The group delay gives an image of the phase linearity within the passband. For example, a constant value of tg means a linear phase, which is one of the regarded features for filters. Furthermore, with a SAW filter device 500 using a transducer structure 600 as illustrated in FIG. 5b, a temperature sensitivity with a first order TCF ($TCF_1$) comprised between −0.9 and 1 ppm/K and a second order TCF ($TCF_2$) comprised between 30 and 36 ppb/K can be achieved. The thermal sensitivity is characterized by the $TCF_1$ and $TCF_2$ around the ambient temperature $T_0=25°$ C. Its expression reads as follows:

$$f=f_0\times(1+TCF_1(T-T_0)+TCF_2(T-T_0)^2)$$

This expression corresponds to a polynomial development of the temperature-frequency dependence limited to the second degree as generally for SAW on standard devices. $TCF_1$ and $TCF_2$ can be accurately obtained by using best fit procedures considering experimental frequency-temperature measurements for a given magnitude/phase point of the transfer function or the reflection coefficient or self admittance, transadmittance or self impedance or transimpedance of the filter.

Figure 5E:
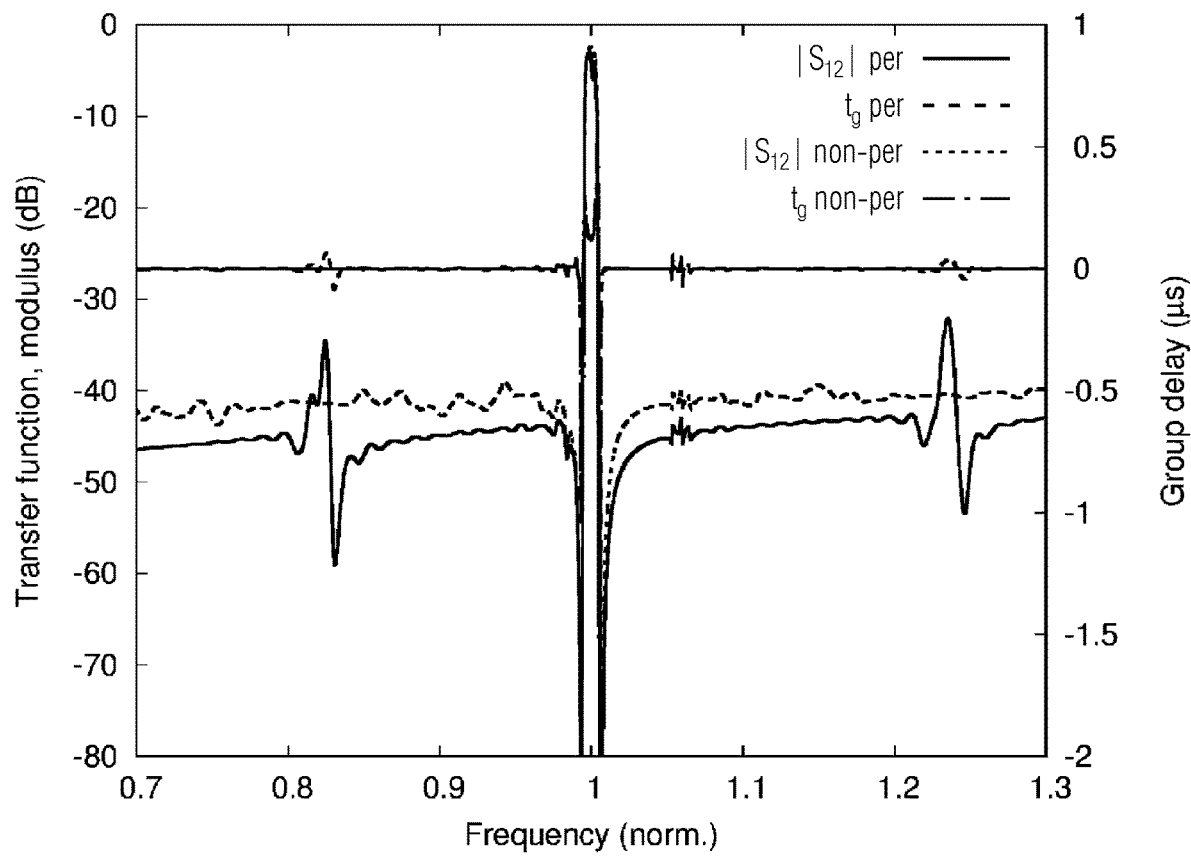
FIG. 5e illustrates the simulation of the SAW filter device characteristics of FIG. 5a, with a transducer structure according to FIG. 5b with and without a non-periodic suppression of electro-acoustic sources according to the fourth embodiment of the present disclosure.

Finally, in FIG. 5e is shown the simulated SAW filter device characteristics for the SAW filter device 500 of FIG. 5a with the transducer structure 600 of FIG. 5b, without and with suppression of electro-acoustic sources in the transducer structure 600. Again in FIG. 5e is illustrated the transfer function modulus on the left Y axis over the normalized frequency on the X axis and the group delay on the right Y axis.

In the case of the periodic configuration of the transducer structure, like in the state of the art, i.e., without electro-acoustic source suppression, two strong parasitic resonances at a value of 0.825 and 1.25 for the normalized frequency, being frequencies outside the bandpass frequency of the SAW filter device, are present.

When a non-periodic distribution of the suppression of electro-acoustic sources is performed, the parasitic resonances at a value of 0.825 and 1.25 have disappeared. Thus, the improvement of out-of-band rejection by elimination of coherent sub-harmonic sources is evident. This is explained by the fact that the non-periodic structure is behaving more like a single period structure without any perturbation due to subharmonics, therefore yielding a better operation of the filter single resonators and therefore an improvement of the overall filter response.

As described above, the effects of parasitic resonances from reflected bulk acoustic wave propagation in a SAW filter device having a composite substrate can be reduced by suppressing electro-acoustic sources in one or more regions of the transducer structure used in the SAW filter device, in such a way that the surface mode resonance frequency $f_r$ of the SAW device remains the same or nearly the same throughout the transducer structure while keeping the structural features, i.e., width and thickness of electrode fingers the same throughout the transducer structure.

A number of embodiments of the present disclosure have been described. Nevertheless, it is understood that various modifications and enhancements may be made without departing from the scope of the invention as defined by the following claims.

The invention claimed is:

1. A transducer structure for a surface acoustic wave device, formed on an acoustic wave propagating substrate, the transducer structure being configured for coupling to an electrical load and/or source, comprising:
a pair of inter-digitated comb electrodes formed on the acoustic wave propagating substrate, wherein the pair of inter-digitated comb electrodes comprises neighboring electrode means belonging to different comb electrodes and having a pitch p being defined as an edge-to-edge electrode means distance between two neighboring electrode means, the pitch p satisfying a Bragg condition given by $p=\lambda/2$, $\lambda$ being an operating acoustic wavelength of the transducer structure, and wherein the electrode means all have a same geometry;
wherein the pair of inter-digitated comb electrodes comprises at least one region in which two or more neighboring electrode means belong to the same comb electrode while having an edge-to-edge distance to each other corresponding to the pitch p and having the same geometry; and
wherein the acoustic wave propagating substrate is a composite substrate comprising at least a base substrate of a first material and a top layer of a piezoelectric material with a thickness being more than one wavelength of the operating acoustic wavelength.

2. The transducer structure according to claim 1, wherein the at least one region comprises a plurality of regions with two or more neighboring electrode means belonging to the same comb electrode.

3. The transducer structure according to claim 2, wherein regions of the plurality of regions with two or more neighboring electrode means belonging to the same comb electrode are not periodically distributed.

4. The transducer structure according to claim 1, wherein the electrode means is an electrode finger, or split fingers comprising two or more adjacent electrode fingers at a same potential.

5. The transducer structure according to claim 1, wherein the at least one region with two or more neighboring electrode means belonging to the same comb electrode comprises an even number of neighboring electrode means belonging to the same comb electrode.

6. The transducer structure according to claim 1, wherein the at least one region with two or more neighboring electrode means belonging to the same comb electrode comprises an odd number of neighboring electrode means belonging to the same comb electrode.

7. The transducer structure according to claim 1, wherein the at least one region comprises at least two regions and the number of neighboring electrode means belonging to the same comb electrode is different amongst the at least two regions with two or more neighboring electrode means belonging to the same comb electrode.

8. The transducer structure according to claim 1, wherein the neighboring electrode means belonging to the same comb electrode are provided on both comb electrodes.

9. The transducer structure according to claim 1, wherein the piezoelectric layer is Lithium Tantalate ($LiTaO_3$) or Lithium Niobate ($LiNbO_3$).

10. The transducer structure according to claim 9, wherein the piezoelectric layer is Lithium Niobate $LiNbO_3$ with a crystal orientation defined according to standard IEEE 1949 Std-176 as (YXl)/$\partial$ with $36°<\partial<52°$ or $60°<\partial<68°$ or $120°<\partial<140°$, or as (YXt)/$\Psi$ with $85°<\Psi<95°$, or as (YXwlt)/$\phi\partial\Psi$ with $\phi=90°$, $-30°<\partial<+45°$ and $0°<\Psi<45°$.

11. The transducer structure according to claim 9, wherein the piezoelectric layer is Lithium Tantalate $LiTaO_3$ with a crystal orientation defined according to standard IEEE 1949 Std-176 as (YXl)/∂ with 36°<∂<52°.

12. The transducer structure according to claim 1, wherein the first material of the base substrate has a thermal expansion coefficient smaller than a thermal expansion coefficient of the piezoelectric material.

13. A surface acoustic wave filter device comprising at least one transducer structure according to claim 1.

14. The transducer structure according to claim 1, wherein the first material of the base substrate and the piezoelectric material have different temperature coefficient of frequency (TCF).

15. A transducer structure for a surface acoustic wave device, formed on an acoustic wave propagating substrate, the transducer structure being configured for coupling to an electrical load and/or source, comprising:
a pair of inter-digitated comb electrodes formed on the acoustic wave propagating substrate, wherein the pair of inter-digitated comb electrodes comprises neighboring electrode means belonging to different comb electrodes and having a pitch p being defined as an edge-to-edge electrode means distance between two neighboring electrode means, the pitch p satisfying a Bragg condition given by p=λ/2, λ being an operating acoustic wavelength of the transducer structure, and wherein the electrode means all have a same geometry;
wherein the pair of inter-digitated comb electrodes comprises at least two regions in which two or more neighboring electrode means belong to the same comb electrode while having an edge-to-edge distance to each other corresponding to the pitch p and having the same geometry; and
wherein the number of neighboring electrode means belonging to the same comb electrode is different amongst at least two regions with two or more neighboring electrode means belonging to the same comb electrode.

16. The transducer structure of claim 15, wherein the electrode means is an electrode finger, or split fingers comprising two or more adjacent electrode fingers at a same potential.

17. The transducer structure of claim 15, wherein regions of the at least two regions with two or more neighboring electrode means belonging to the same comb electrode are not periodically distributed.

18. The transducer structure of claim 15, wherein the at least two regions with two or more neighboring electrode means belonging to the same comb electrode comprise an even number of neighboring electrode means belonging to the same comb electrode.

19. The transducer structure of claim 15, wherein the at least two regions with two or more neighboring electrode means belonging to the same comb electrode comprises an odd number of neighboring electrode means belonging to the same comb electrode.

20. The transducer of claim 15, wherein the acoustic wave propagating substrate is a composite substrate comprising at least a base substrate of a first material and a top layer of a piezoelectric material, wherein the piezoelectric layer is Lithium Tantalate (LiTaO3), in particular Lithium Tantalate LiTaO3 with a crystal orientation defined according to standard IEEE 1949 Std-176 as (YXl)/∂ with 36°<∂<52°, or Lithium Niobate (LiNbO3), in particular Lithium Niobate LiNbO3 with a crystal orientation defined according to standard IEEE 1949 Std-176 as (YXl)/∂ with 36°<∂<52° or 60°<∂<68° or 120°<∂<140°, or as (YXt)/ Ψ with 85°<Ψ<95°, or as (YXwlt)/φ∂Ψ with φ=90°, −30°<∂<+45° and 0°<Ψ<45°, with a thickness being more than one wavelength of the operating acoustic wavelength.

21. The transducer structure of claim 20, wherein the material of the base substrate and the piezoelectric material have different temperature coefficient of frequency (TCF).

22. The transducer structure of claim 20, wherein the material of the base substrate has a thermal expansion coefficient smaller than a thermal expansion coefficient of the piezoelectric material.

23. A surface acoustic wave filter device comprising at least one transducer structure according to claim 15.

* * * * *